United States Patent
Hazani

(10) Patent No.: US 10,361,782 B2
(45) Date of Patent: *Jul. 23, 2019

(54) CABLING CONNECTIVITY MONITORING AND VERIFICATION

(71) Applicant: Corning Optical Communications LLC, Hickory, NC (US)

(72) Inventor: Ami Hazani, Ra'anana (IL)

(73) Assignee: Corning Optical Communications LLC, Hickory, NC (US)

( * ) Notice: Subject to any disclaimer, the term of this patent is extended or adjusted under 35 U.S.C. 154(b) by 126 days.

This patent is subject to a terminal disclaimer.

(21) Appl. No.: 15/472,864

(22) Filed: Mar. 29, 2017

(65) Prior Publication Data

US 2017/0201438 A1     Jul. 13, 2017

Related U.S. Application Data

(63) Continuation of application No. 14/086,491, filed on Nov. 21, 2013, now Pat. No. 9,647,758.

(Continued)

(51) Int. Cl.
*H04B 10/2575* (2013.01)
*H04B 10/07* (2013.01)
(Continued)

(52) U.S. Cl.
CPC ....... *H04B 10/25753* (2013.01); *H04B 10/07* (2013.01); *H04L 41/12* (2013.01);
(Continued)

(58) Field of Classification Search
CPC ............. H04B 10/25753; H04B 10/07; H04L 43/0811; H04L 43/50; H04L 41/12; G01R 31/04
See application file for complete search history.

(56) References Cited

U.S. PATENT DOCUMENTS

| 2,628,312 A | 2/1953 | Peterson et al. |
| 4,167,738 A | 9/1979 | Kirkendall |

(Continued)

FOREIGN PATENT DOCUMENTS

| AU | 645192 B | 10/1992 |
| AU | 731180 B2 | 3/1998 |

(Continued)

OTHER PUBLICATIONS

Final Office Action for U.S. Appl. No. 14/887,868, dated Nov. 22, 2017, 15 pages.

(Continued)

*Primary Examiner* — Andrew Lai
*Assistant Examiner* — Sumitra Ganguly
(74) *Attorney, Agent, or Firm* — C. Keith Montgomery

(57) ABSTRACT

Connectivity between components in a system is monitored by applying a low voltage at one end of an RF cable, interpreted as a "0" logical state, and determining whether a similar voltage appears at the other end of the cable. If the cable is connected properly, the DC voltage applied at one end will appear at the other end and a proper indication is generated. If the expected voltage level does not appear at the other side, it means that RF connection was not correctly established and an alert is generated. Test systems for testing connectivity may include a first component comprising at least one port, at least one capacitor, and at least one resistor for providing high impedance. A controller provides a first logic state to the at least one port, scans multiple input ports of the system, and records a link corresponding to the applied first logic state.

18 Claims, 10 Drawing Sheets

Related U.S. Application Data

(60) Provisional application No. 61/731,826, filed on Nov. 30, 2012.

(51) Int. Cl.
*H04L 12/26* (2006.01)
*H04L 12/24* (2006.01)
*G01R 31/04* (2006.01)

(52) U.S. Cl.
CPC .......... *H04L 43/0811* (2013.01); *H04L 43/50* (2013.01); *G01R 31/04* (2013.01)

(56) References Cited

U.S. PATENT DOCUMENTS

| | | |
|---|---|---|
| 4,365,865 A | 12/1982 | Stiles |
| 4,449,246 A | 5/1984 | Seiler et al. |
| 4,573,212 A | 2/1986 | Lipsky |
| 4,665,560 A | 5/1987 | Lange |
| 4,867,527 A | 9/1989 | Dotti et al. |
| 4,889,977 A | 12/1989 | Haydon |
| 4,896,939 A | 1/1990 | O'Brien |
| 4,916,460 A | 4/1990 | Powell |
| 4,935,746 A | 6/1990 | Wells |
| 4,939,852 A | 7/1990 | Brenner |
| 4,972,346 A | 11/1990 | Kawano et al. |
| 5,039,195 A | 8/1991 | Jenkins et al. |
| 5,042,086 A | 8/1991 | Cole et al. |
| 5,056,109 A | 10/1991 | Gilhousen et al. |
| 5,059,927 A | 10/1991 | Cohen |
| 5,125,060 A | 6/1992 | Edmundson |
| 5,187,803 A | 2/1993 | Sohner et al. |
| 5,189,718 A | 2/1993 | Barrett et al. |
| 5,189,719 A | 2/1993 | Coleman et al. |
| 5,206,655 A | 4/1993 | Caille et al. |
| 5,208,812 A | 5/1993 | Dudek et al. |
| 5,210,812 A | 5/1993 | Nilsson et al. |
| 5,257,407 A | 10/1993 | Heinzelmann |
| 5,260,957 A | 11/1993 | Hakimi |
| 5,263,108 A | 11/1993 | Kurokawa et al. |
| 5,267,122 A | 11/1993 | Glover et al. |
| 5,268,971 A | 12/1993 | Nilsson et al. |
| 5,278,690 A | 1/1994 | Vella-Coleiro |
| 5,278,989 A | 1/1994 | Burke et al. |
| 5,280,472 A | 1/1994 | Gilhousen et al. |
| 5,299,947 A | 4/1994 | Barnard |
| 5,301,056 A | 4/1994 | O'Neill |
| 5,325,223 A | 6/1994 | Bears |
| 5,339,058 A | 8/1994 | Lique |
| 5,339,184 A | 8/1994 | Tang |
| 5,343,320 A | 8/1994 | Anderson |
| 5,377,035 A | 12/1994 | Wang et al. |
| 5,379,455 A | 1/1995 | Koschek |
| 5,381,459 A | 1/1995 | Lappington |
| 5,396,224 A | 3/1995 | Dukes et al. |
| 5,400,391 A | 3/1995 | Emura et al. |
| 5,420,863 A | 5/1995 | Taketsugu et al. |
| 5,424,864 A | 6/1995 | Emura |
| 5,436,554 A * | 7/1995 | Decker, Jr. ............ G01R 31/023 324/539 |
| 5,444,564 A | 8/1995 | Newberg |
| 5,457,557 A | 10/1995 | Zarem et al. |
| 5,459,727 A | 10/1995 | Vannucci |
| 5,469,523 A | 11/1995 | Blew et al. |
| 5,513,176 A | 4/1996 | Dean et al. |
| 5,519,830 A | 5/1996 | Opoczynski |
| 5,533,053 A * | 7/1996 | Hershbarger ......... H04J 3/0685 333/33 |
| 5,543,000 A | 8/1996 | Lique |
| 5,546,443 A | 8/1996 | Raith |
| 5,557,698 A | 9/1996 | Gareis et al. |
| 5,574,815 A | 11/1996 | Kneeland |
| 5,598,288 A | 1/1997 | Collar |
| 5,606,725 A | 2/1997 | Hart |
| 5,615,034 A | 3/1997 | Hori |
| 5,627,879 A | 5/1997 | Russell et al. |
| 5,640,678 A | 6/1997 | Ishikawa et al. |
| 5,642,405 A | 6/1997 | Fischer et al. |
| 5,644,622 A | 7/1997 | Russell et al. |
| 5,648,961 A | 7/1997 | Ebihara |
| 5,651,081 A | 7/1997 | Blew et al. |
| 5,657,374 A | 8/1997 | Russell et al. |
| 5,668,562 A | 9/1997 | Cutrer et al. |
| 5,677,974 A | 10/1997 | Elms et al. |
| 5,682,256 A | 10/1997 | Motley et al. |
| 5,694,232 A | 12/1997 | Parsay et al. |
| 5,703,602 A | 12/1997 | Casebolt |
| 5,708,681 A | 1/1998 | Malkemes et al. |
| 5,726,984 A | 3/1998 | Kubler et al. |
| 5,765,099 A | 6/1998 | Georges et al. |
| 5,768,700 A * | 6/1998 | Kardontchik ........ H03D 7/1441 330/254 |
| 5,790,536 A | 8/1998 | Mahany et al. |
| 5,790,606 A | 8/1998 | Dent |
| 5,793,772 A | 8/1998 | Burke et al. |
| 5,802,173 A | 9/1998 | Hamilton-Piercy et al. |
| 5,802,473 A | 9/1998 | Rutledge et al. |
| 5,805,975 A | 9/1998 | Green, Sr. et al. |
| 5,805,983 A | 9/1998 | Naidu et al. |
| 5,809,395 A | 9/1998 | Hamilton-Piercy et al. |
| 5,809,431 A | 9/1998 | Bustamante et al. |
| 5,812,296 A | 9/1998 | Tarusawa et al. |
| 5,818,619 A | 10/1998 | Medved et al. |
| 5,818,883 A | 10/1998 | Smith et al. |
| 5,821,510 A | 10/1998 | Cohen et al. |
| 5,825,651 A | 10/1998 | Gupta et al. |
| 5,838,474 A | 11/1998 | Stilling |
| 5,839,052 A | 11/1998 | Dean et al. |
| 5,852,651 A | 12/1998 | Fischer et al. |
| 5,854,986 A | 12/1998 | Dorren et al. |
| 5,859,719 A | 1/1999 | Dentai et al. |
| 5,862,460 A | 1/1999 | Rich |
| 5,867,485 A | 2/1999 | Chambers et al. |
| 5,867,763 A | 2/1999 | Dean et al. |
| 5,881,200 A | 3/1999 | Burt |
| 5,883,882 A | 3/1999 | Schwartz |
| 5,896,568 A | 4/1999 | Tseng et al. |
| 5,903,834 A | 5/1999 | Wallstedt et al. |
| 5,910,776 A | 6/1999 | Black |
| 5,913,003 A | 6/1999 | Arroyo et al. |
| 5,917,636 A | 6/1999 | Wake et al. |
| 5,930,682 A | 7/1999 | Schwartz et al. |
| 5,936,754 A | 8/1999 | Ariyavisitakul et al. |
| 5,943,372 A | 8/1999 | Gans et al. |
| 5,946,622 A | 8/1999 | Bojeryd |
| 5,949,564 A | 9/1999 | Wake |
| 5,953,670 A | 9/1999 | Newson |
| 5,959,531 A | 9/1999 | Gallagher, III et al. |
| 5,960,344 A | 9/1999 | Mahany |
| 5,969,837 A | 10/1999 | Farber et al. |
| 5,983,070 A | 11/1999 | Georges et al. |
| 5,987,303 A | 11/1999 | Dutta et al. |
| 6,005,884 A | 12/1999 | Cook et al. |
| 6,006,069 A | 12/1999 | Langston et al. |
| 6,006,105 A | 12/1999 | Rostoker et al. |
| 6,011,962 A | 1/2000 | Lindenmeier et al. |
| 6,011,980 A | 1/2000 | Nagano et al. |
| 6,014,546 A | 1/2000 | Georges et al. |
| 6,016,426 A | 1/2000 | Bodell |
| 6,023,625 A | 2/2000 | Myers, Jr. |
| 6,037,898 A | 3/2000 | Parish et al. |
| 6,061,161 A | 5/2000 | Yang et al. |
| 6,069,721 A | 5/2000 | Oh et al. |
| 6,088,381 A | 7/2000 | Myers, Jr. |
| 6,108,536 A | 8/2000 | Yafuso et al. |
| 6,118,767 A | 9/2000 | Shen et al. |
| 6,122,529 A | 9/2000 | Sabat, Jr. et al. |
| 6,127,917 A | 10/2000 | Tuttle |
| 6,128,470 A | 10/2000 | Naidu et al. |
| 6,128,477 A | 10/2000 | Freed |
| 6,148,041 A | 11/2000 | Dent |
| 6,150,921 A | 11/2000 | Werb et al. |
| 6,157,810 A | 12/2000 | Georges et al. |
| 6,192,216 B1 | 2/2001 | Sabat, Jr. et al. |

(56) References Cited

U.S. PATENT DOCUMENTS

| | | |
|---|---|---|
| 6,194,968 B1 | 2/2001 | Winslow |
| 6,195,561 B1 | 2/2001 | Rose |
| 6,212,397 B1 | 4/2001 | Langston et al. |
| 6,222,503 B1 | 4/2001 | Gietema |
| 6,223,201 B1 | 4/2001 | Reznak |
| 6,232,870 B1 | 5/2001 | Garber et al. |
| 6,236,789 B1 | 5/2001 | Fitz |
| 6,236,863 B1 | 5/2001 | Waldroup et al. |
| 6,240,274 B1 | 5/2001 | Izadpanah |
| 6,246,500 B1 | 6/2001 | Ackerman |
| 6,253,067 B1 | 6/2001 | Tsuji |
| 6,268,946 B1 | 7/2001 | Larkin et al. |
| 6,275,990 B1 | 8/2001 | Dapper et al. |
| 6,279,158 B1 | 8/2001 | Geile et al. |
| 6,286,163 B1 | 9/2001 | Trimble |
| 6,291,924 B1 * | 9/2001 | Lau .................. H03H 9/145 310/313 B |
| 6,292,673 B1 | 9/2001 | Maeda et al. |
| 6,295,451 B1 | 9/2001 | Mimura |
| 6,301,240 B1 | 10/2001 | Slabinski et al. |
| 6,307,869 B1 | 10/2001 | Pawelski |
| 6,314,163 B1 | 11/2001 | Acampora |
| 6,317,599 B1 | 11/2001 | Rappaport et al. |
| 6,323,980 B1 | 11/2001 | Bloom |
| 6,324,391 B1 | 11/2001 | Bodell |
| 6,330,241 B1 | 12/2001 | Fort |
| 6,330,244 B1 | 12/2001 | Swartz et al. |
| 6,334,219 B1 | 12/2001 | Hill et al. |
| 6,336,021 B1 | 1/2002 | Nukada |
| 6,336,042 B1 | 1/2002 | Dawson et al. |
| 6,337,754 B1 | 1/2002 | Imajo |
| 6,340,932 B1 | 1/2002 | Rodgers et al. |
| 6,353,406 B1 | 3/2002 | Lanzl et al. |
| 6,353,600 B1 | 3/2002 | Schwartz et al. |
| 6,359,714 B1 | 3/2002 | Imajo |
| 6,370,203 B1 | 4/2002 | Boesch et al. |
| 6,374,078 B1 | 4/2002 | Williams et al. |
| 6,374,124 B1 | 4/2002 | Slabinski |
| 6,389,010 B1 | 5/2002 | Kubler et al. |
| 6,400,318 B1 | 6/2002 | Kasami et al. |
| 6,400,418 B1 | 6/2002 | Wakabayashi |
| 6,404,775 B1 | 6/2002 | Leslie et al. |
| 6,405,018 B1 | 6/2002 | Reudink et al. |
| 6,405,058 B2 | 6/2002 | Bobier |
| 6,405,308 B1 | 6/2002 | Gupta et al. |
| 6,414,624 B2 | 7/2002 | Endo et al. |
| 6,415,132 B1 | 7/2002 | Sabat, Jr. |
| 6,421,327 B1 | 7/2002 | Lundby et al. |
| 6,437,577 B1 * | 8/2002 | Fritzmann ............ H01Q 1/32 324/523 |
| 6,438,301 B1 | 8/2002 | Johnson et al. |
| 6,438,371 B1 | 8/2002 | Fujise et al. |
| 6,448,558 B1 | 9/2002 | Greene |
| 6,452,915 B1 | 9/2002 | Jorgensen |
| 6,459,519 B1 | 10/2002 | Sasai et al. |
| 6,459,989 B1 | 10/2002 | Kirkpatrick et al. |
| 6,477,154 B1 | 11/2002 | Cheong et al. |
| 6,480,702 B1 | 11/2002 | Sabat, Jr. |
| 6,486,907 B1 | 11/2002 | Farber et al. |
| 6,490,439 B1 | 12/2002 | Croft et al. |
| 6,496,290 B1 | 12/2002 | Lee |
| 6,501,965 B1 | 12/2002 | Lucidarme |
| 6,504,636 B1 | 1/2003 | Seto et al. |
| 6,504,831 B1 | 1/2003 | Greenwood et al. |
| 6,512,478 B1 | 1/2003 | Chien |
| 6,519,395 B1 | 2/2003 | Bevan et al. |
| 6,519,449 B1 | 2/2003 | Zhang et al. |
| 6,525,855 B1 | 2/2003 | Westbrook et al. |
| 6,535,330 B1 | 3/2003 | Lelic et al. |
| 6,535,720 B1 | 3/2003 | Kintis et al. |
| 6,556,551 B1 | 4/2003 | Schwartz |
| 6,577,794 B1 | 6/2003 | Currie et al. |
| 6,577,801 B2 | 6/2003 | Broderick et al. |
| 6,580,402 B2 | 6/2003 | Navarro et al. |
| 6,580,905 B1 | 6/2003 | Naidu et al. |
| 6,580,918 B1 | 6/2003 | Leickel et al. |
| 6,583,763 B2 | 6/2003 | Judd |
| 6,587,514 B1 | 7/2003 | Wright et al. |
| 6,594,496 B2 | 7/2003 | Schwartz |
| 6,597,325 B2 | 7/2003 | Judd et al. |
| 6,598,009 B2 | 7/2003 | Yang |
| 6,606,430 B2 | 8/2003 | Bartur et al. |
| 6,615,074 B2 | 9/2003 | Mickle et al. |
| 6,628,732 B1 | 9/2003 | Takaki |
| 6,634,811 B1 | 10/2003 | Gertel et al. |
| 6,636,747 B2 | 10/2003 | Harada et al. |
| 6,640,103 B1 | 10/2003 | Inman et al. |
| 6,643,437 B1 | 11/2003 | Park |
| 6,652,158 B2 | 11/2003 | Bartur et al. |
| 6,654,590 B2 | 11/2003 | Boros et al. |
| 6,654,616 B1 | 11/2003 | Pope, Jr. et al. |
| 6,657,535 B1 | 12/2003 | Magbie et al. |
| 6,658,269 B1 | 12/2003 | Golemon et al. |
| 6,665,308 B1 | 12/2003 | Rakib et al. |
| 6,670,930 B2 | 12/2003 | Navarro |
| 6,674,966 B1 | 1/2004 | Koonen |
| 6,675,294 B1 | 1/2004 | Gupta et al. |
| 6,678,509 B2 | 1/2004 | Skarman et al. |
| 6,687,437 B1 | 2/2004 | Starnes et al. |
| 6,690,328 B2 | 2/2004 | Judd |
| 6,701,137 B1 | 3/2004 | Judd et al. |
| 6,704,298 B1 | 3/2004 | Matsumiya et al. |
| 6,704,545 B1 | 3/2004 | Wala |
| 6,710,366 B1 | 3/2004 | Lee et al. |
| 6,714,800 B2 | 3/2004 | Johnson et al. |
| 6,731,880 B2 | 5/2004 | Westbrook et al. |
| 6,745,013 B1 | 6/2004 | Porter et al. |
| 6,758,913 B1 | 7/2004 | Tunney et al. |
| 6,763,226 B1 | 7/2004 | McZeal, Jr. |
| 6,771,862 B2 | 8/2004 | Karnik et al. |
| 6,771,933 B1 | 8/2004 | Eng et al. |
| 6,784,802 B1 | 8/2004 | Stanescu |
| 6,785,558 B1 | 8/2004 | Stratford et al. |
| 6,788,666 B1 | 9/2004 | Linebarger et al. |
| 6,801,767 B1 | 10/2004 | Schwartz et al. |
| 6,807,374 B1 | 10/2004 | Imajo et al. |
| 6,812,824 B1 | 11/2004 | Goldinger et al. |
| 6,812,905 B2 | 11/2004 | Thomas et al. |
| 6,823,174 B1 | 11/2004 | Masenten et al. |
| 6,826,163 B2 | 11/2004 | Mani et al. |
| 6,826,164 B2 | 11/2004 | Mani et al. |
| 6,826,337 B2 | 11/2004 | Linnell |
| 6,836,660 B1 | 12/2004 | Wala |
| 6,836,673 B1 | 12/2004 | Trott |
| 6,836,757 B1 | 12/2004 | Swoboda |
| 6,842,433 B2 | 1/2005 | West et al. |
| 6,847,856 B1 | 1/2005 | Bohannon |
| 6,850,510 B2 | 2/2005 | Kubler |
| 6,865,390 B2 | 3/2005 | Goss et al. |
| 6,873,823 B2 | 3/2005 | Hasarchi |
| 6,876,056 B2 | 4/2005 | Tilmans et al. |
| 6,879,290 B1 | 4/2005 | Toutain et al. |
| 6,882,311 B2 | 4/2005 | Walker et al. |
| 6,883,710 B2 | 4/2005 | Chung |
| 6,885,344 B2 | 4/2005 | Mohamadi |
| 6,885,846 B1 | 4/2005 | Panasik et al. |
| 6,889,060 B2 | 5/2005 | Fernando et al. |
| 6,906,681 B2 | 6/2005 | Hoppenstein |
| 6,909,399 B1 | 6/2005 | Zegelin et al. |
| 6,915,058 B2 | 7/2005 | Pons |
| 6,915,529 B1 | 7/2005 | Suematsu et al. |
| 6,919,858 B2 | 7/2005 | Rofougaran |
| 6,920,330 B2 | 7/2005 | Caronni et al. |
| 6,924,997 B2 | 8/2005 | Chen et al. |
| 6,928,281 B2 | 8/2005 | Ward et al. |
| 6,930,987 B1 | 8/2005 | Fukuda et al. |
| 6,931,183 B2 | 8/2005 | Panak et al. |
| 6,931,659 B1 | 8/2005 | Kinemura |
| 6,933,849 B2 | 8/2005 | Sawyer |
| 6,934,511 B1 | 8/2005 | Lovinggood et al. |
| 6,934,541 B2 | 8/2005 | Miyatani |
| 6,941,112 B2 | 9/2005 | Hasegawa |
| 6,946,989 B2 | 9/2005 | Vavik |
| 6,961,312 B2 | 11/2005 | Kubler et al. |

(56) References Cited

U.S. PATENT DOCUMENTS

| | | |
|---|---|---|
| 6,963,289 B2 | 11/2005 | Aljadeff et al. |
| 6,963,552 B2 | 11/2005 | Sabat, Jr. et al. |
| 6,965,718 B2 | 11/2005 | Koertel |
| 6,967,347 B2 | 11/2005 | Estes et al. |
| 6,968,107 B2 | 11/2005 | Belardi et al. |
| 6,970,652 B2 | 11/2005 | Zhang et al. |
| 6,973,243 B2 | 12/2005 | Koyasu et al. |
| 6,974,262 B1 | 12/2005 | Rickenbach |
| 6,977,502 B1 | 12/2005 | Hertz |
| 6,983,174 B2 | 1/2006 | Hoppenstein et al. |
| 7,002,511 B1 | 2/2006 | Ammar et al. |
| 7,006,465 B2 | 2/2006 | Toshimitsu et al. |
| 7,013,087 B2 | 3/2006 | Suzuki et al. |
| 7,015,826 B1 | 3/2006 | Chan et al. |
| 7,020,473 B2 | 3/2006 | Splett |
| 7,020,488 B1 | 3/2006 | Bleile et al. |
| 7,024,166 B2 | 4/2006 | Wallace |
| 7,035,512 B2 | 4/2006 | Van Bijsterveld |
| 7,035,594 B2 | 4/2006 | Wallace et al. |
| 7,039,399 B2 | 5/2006 | Fischer |
| 7,043,271 B1 | 5/2006 | Seto et al. |
| 7,047,028 B2 | 5/2006 | Cagenius et al. |
| 7,050,017 B2 | 5/2006 | King et al. |
| 7,053,838 B2 | 5/2006 | Judd |
| 7,054,513 B2 | 5/2006 | Herz et al. |
| 7,069,577 B2 | 6/2006 | Geile et al. |
| 7,072,586 B2 | 7/2006 | Aburakawa et al. |
| 7,082,320 B2 | 7/2006 | Kattukaran et al. |
| 7,084,769 B2 | 8/2006 | Bauer et al. |
| 7,093,985 B2 | 8/2006 | Lord et al. |
| 7,103,119 B2 | 9/2006 | Matsuoka et al. |
| 7,103,377 B2 | 9/2006 | Bauman et al. |
| 7,106,252 B2 | 9/2006 | Smith et al. |
| 7,106,931 B2 | 9/2006 | Sutehall et al. |
| 7,110,795 B2 | 9/2006 | Doi |
| 7,114,859 B1 | 10/2006 | Tuohimaa et al. |
| 7,127,175 B2 | 10/2006 | Mani et al. |
| 7,127,176 B2 | 10/2006 | Sasaki |
| 7,131,135 B1 | 10/2006 | Virag et al. |
| 7,142,503 B1 | 11/2006 | Grant et al. |
| 7,142,535 B2 | 11/2006 | Kubler et al. |
| 7,142,619 B2 | 11/2006 | Sommer et al. |
| 7,146,134 B2 | 12/2006 | Moon et al. |
| 7,146,506 B1 | 12/2006 | Hannah et al. |
| 7,160,032 B2 | 1/2007 | Nagashima et al. |
| 7,171,244 B2 | 1/2007 | Bauman |
| 7,184,728 B2 | 2/2007 | Solum |
| 7,190,748 B2 | 3/2007 | Kim et al. |
| 7,194,023 B2 | 3/2007 | Norrell et al. |
| 7,199,443 B2 | 4/2007 | Elsharawy |
| 7,200,305 B2 | 4/2007 | Dion et al. |
| 7,200,391 B2 | 4/2007 | Chung et al. |
| 7,228,072 B2 | 6/2007 | Mickelsson et al. |
| 7,233,771 B2 | 6/2007 | Proctor, Jr. et al. |
| 7,263,293 B2 | 8/2007 | Ommodt et al. |
| 7,269,311 B2 | 9/2007 | Kim et al. |
| 7,272,359 B2 | 9/2007 | Li et al. |
| 7,280,011 B2 | 10/2007 | Bayar et al. |
| 7,286,843 B2 | 10/2007 | Scheck |
| 7,286,854 B2 | 10/2007 | Ferrato et al. |
| 7,295,119 B2 | 11/2007 | Rappaport et al. |
| 7,310,430 B1 | 12/2007 | Mallya et al. |
| 7,313,415 B2 | 12/2007 | Wake et al. |
| 7,315,735 B2 | 1/2008 | Graham |
| 7,324,730 B2 | 1/2008 | Varkey et al. |
| 7,324,837 B2 | 1/2008 | Yamakita |
| 7,343,164 B2 | 3/2008 | Kallstenius |
| 7,348,843 B1 | 3/2008 | Qiu et al. |
| 7,349,633 B2 | 3/2008 | Lee et al. |
| 7,359,408 B2 | 4/2008 | Kim |
| 7,359,674 B2 | 4/2008 | Markki et al. |
| 7,366,150 B2 | 4/2008 | Lee et al. |
| 7,366,151 B2 | 4/2008 | Kubler et al. |
| 7,369,526 B2 | 5/2008 | Lechleider et al. |
| 7,379,669 B2 | 5/2008 | Kim |
| 7,385,384 B2 | 6/2008 | Rocher |
| 7,388,892 B2 | 6/2008 | Nishiyama et al. |
| 7,392,025 B2 | 6/2008 | Rooyen et al. |
| 7,392,029 B2 | 6/2008 | Pronkine |
| 7,394,883 B2 | 7/2008 | Funakubo et al. |
| 7,403,156 B2 | 7/2008 | Coppi et al. |
| 7,409,159 B2 | 8/2008 | Izadpanah |
| 7,412,224 B2 | 8/2008 | Kotola et al. |
| 7,421,288 B2 | 9/2008 | Funakubo |
| 7,424,228 B1 | 9/2008 | Williams et al. |
| 7,444,051 B2 | 10/2008 | Tatat et al. |
| 7,450,853 B2 | 11/2008 | Kim et al. |
| 7,450,854 B2 | 11/2008 | Lee et al. |
| 7,451,365 B2 | 11/2008 | Wang et al. |
| 7,454,222 B2 | 11/2008 | Huang et al. |
| 7,460,507 B2 | 12/2008 | Kubler et al. |
| 7,460,829 B2 | 12/2008 | Utsumi et al. |
| 7,460,831 B2 | 12/2008 | Hasarchi |
| 7,466,925 B2 | 12/2008 | Iannelli |
| 7,469,105 B2 | 12/2008 | Wake et al. |
| 7,477,597 B2 | 1/2009 | Segel |
| 7,483,504 B2 | 1/2009 | Shapira et al. |
| 7,483,711 B2 | 1/2009 | Burchfiel |
| 7,496,070 B2 | 2/2009 | Vesuna |
| 7,496,384 B2 | 2/2009 | Seto et al. |
| 7,505,747 B2 | 3/2009 | Solum |
| 7,512,419 B2 | 3/2009 | Solum |
| 7,512,450 B2 | 3/2009 | Ahmed |
| 7,522,552 B2 | 4/2009 | Fein et al. |
| 7,539,509 B2 | 5/2009 | Bauman et al. |
| 7,542,452 B2 | 6/2009 | Penumetsa |
| 7,546,138 B2 | 6/2009 | Bauman |
| 7,548,138 B2 | 6/2009 | Kamgaing |
| 7,548,695 B2 | 6/2009 | Wake |
| 7,548,833 B2 | 6/2009 | Ahmed |
| 7,551,641 B2 | 6/2009 | Pirzada et al. |
| 7,557,758 B2 | 7/2009 | Rofougaran |
| 7,580,384 B2 | 8/2009 | Kubler et al. |
| 7,586,861 B2 | 9/2009 | Kubler et al. |
| 7,590,354 B2 | 9/2009 | Sauer et al. |
| 7,593,704 B2 | 9/2009 | Pinel et al. |
| 7,599,420 B2 | 10/2009 | Forenza et al. |
| 7,599,672 B2 | 10/2009 | Shoji et al. |
| 7,610,046 B2 | 10/2009 | Wala |
| 7,630,690 B2 | 12/2009 | Kaewell, Jr. et al. |
| 7,633,934 B2 | 12/2009 | Kubler et al. |
| 7,639,982 B2 | 12/2009 | Wala |
| 7,646,743 B2 | 1/2010 | Kubler et al. |
| 7,646,777 B2 | 1/2010 | Hicks, III et al. |
| 7,653,397 B2 | 1/2010 | Pernu et al. |
| 7,668,565 B2 | 2/2010 | Ylänen et al. |
| 7,675,936 B2 | 3/2010 | Mizutani et al. |
| 7,688,811 B2 | 3/2010 | Kubler et al. |
| 7,693,486 B2 | 4/2010 | Kasslin et al. |
| 7,693,654 B1 | 4/2010 | Dietsch et al. |
| 7,697,467 B2 | 4/2010 | Kubler et al. |
| 7,697,574 B2 | 4/2010 | Suematsu et al. |
| 7,715,375 B2 | 5/2010 | Kubler et al. |
| 7,720,510 B2 | 5/2010 | Pescod et al. |
| 7,751,374 B2 | 7/2010 | Donovan |
| 7,751,838 B2 | 7/2010 | Ramesh et al. |
| 7,760,703 B2 | 7/2010 | Kubler et al. |
| 7,761,093 B2 | 7/2010 | Sabat, Jr. et al. |
| 7,768,951 B2 | 8/2010 | Kubler et al. |
| 7,773,573 B2 | 8/2010 | Chung et al. |
| 7,778,603 B2 | 8/2010 | Palin et al. |
| 7,787,823 B2 | 8/2010 | George et al. |
| 7,805,073 B2 | 9/2010 | Sabat, Jr. et al. |
| 7,809,012 B2 | 10/2010 | Ruuska et al. |
| 7,812,766 B2 | 10/2010 | Leblanc et al. |
| 7,812,775 B2 | 10/2010 | Babakhani et al. |
| 7,817,969 B2 | 10/2010 | Castaneda et al. |
| 7,835,328 B2 | 11/2010 | Stephens et al. |
| 7,848,316 B2 | 12/2010 | Kubler et al. |
| 7,848,770 B2 | 12/2010 | Scheinert |
| 7,853,234 B2 | 12/2010 | Afsahi |
| 7,870,321 B2 | 1/2011 | Rofougaran |
| 7,880,677 B2 | 2/2011 | Rofougaran et al. |
| 7,881,755 B1 | 2/2011 | Mishra et al. |

(56) References Cited

U.S. PATENT DOCUMENTS

| | | |
|---|---|---|
| 7,894,423 B2 | 2/2011 | Kubler et al. |
| 7,899,007 B2 | 3/2011 | Kubler et al. |
| 7,907,972 B2 | 3/2011 | Walton et al. |
| 7,912,043 B2 | 3/2011 | Kubler et al. |
| 7,912,506 B2 | 3/2011 | Lovberg et al. |
| 7,916,706 B2 | 3/2011 | Kubler et al. |
| 7,917,177 B2 | 3/2011 | Bauman |
| 7,920,553 B2 | 4/2011 | Kubler et al. |
| 7,920,858 B2 | 4/2011 | Sabat, Jr. et al. |
| 7,924,783 B1 | 4/2011 | Mahany et al. |
| 7,936,713 B2 | 5/2011 | Kubler et al. |
| 7,949,364 B2 | 5/2011 | Kasslin et al. |
| 7,957,777 B1 | 6/2011 | Vu et al. |
| 7,962,111 B2 | 6/2011 | Solum |
| 7,969,009 B2 | 6/2011 | Chandrasekaran |
| 7,969,911 B2 | 6/2011 | Mahany et al. |
| 7,990,925 B2 | 8/2011 | Tinnakornsrisuphap et al. |
| 7,996,020 B1 | 8/2011 | Chhabra |
| 8,018,907 B2 | 9/2011 | Kubler et al. |
| 8,023,886 B2 | 9/2011 | Rofougaran |
| 8,027,656 B2 | 9/2011 | Rofougaran et al. |
| 8,036,308 B2 | 10/2011 | Rofougaran |
| 8,082,353 B2 | 12/2011 | Huber et al. |
| 8,086,192 B2 | 12/2011 | Rofougaran et al. |
| 8,135,102 B2 | 3/2012 | Wiwel et al. |
| 8,155,525 B2 | 4/2012 | Cox |
| 8,213,401 B2 | 7/2012 | Fischer et al. |
| 8,223,795 B2 | 7/2012 | Cox et al. |
| 8,238,463 B1 | 8/2012 | Arslan et al. |
| 8,254,848 B1 | 8/2012 | Elliott et al. |
| 8,270,387 B2 | 9/2012 | Cannon et al. |
| 8,290,483 B2 | 10/2012 | Sabat, Jr. et al. |
| 8,306,563 B2 | 11/2012 | Zavadsky et al. |
| 8,346,278 B2 | 1/2013 | Wala et al. |
| 8,428,201 B1 | 4/2013 | McHann, Jr. et al. |
| 8,428,510 B2 | 4/2013 | Stratford et al. |
| 8,462,683 B2 | 6/2013 | Uyehara et al. |
| 8,472,579 B2 | 6/2013 | Uyehara et al. |
| 8,509,215 B2 | 8/2013 | Stuart |
| 8,509,850 B2 | 8/2013 | Zavadsky et al. |
| 8,526,970 B2 | 9/2013 | Wala et al. |
| 8,532,242 B2 | 9/2013 | Fischer et al. |
| 8,626,245 B2 | 1/2014 | Zavadsky et al. |
| 8,737,454 B2 | 5/2014 | Wala et al. |
| 8,743,718 B2 | 6/2014 | Grenier et al. |
| 8,743,756 B2 | 6/2014 | Uyehara et al. |
| 8,831,593 B2 * | 9/2014 | Melester ............ H04B 17/0085 455/424 |
| 8,837,659 B2 | 9/2014 | Uyehara et al. |
| 8,837,940 B2 | 9/2014 | Smith et al. |
| 8,873,585 B2 | 10/2014 | Oren et al. |
| 8,929,288 B2 | 1/2015 | Stewart et al. |
| 9,525,488 B2 | 12/2016 | Beamon et al. |
| 9,647,758 B2 * | 5/2017 | Hazani ................. H04B 10/07 |
| 2001/0036163 A1 | 11/2001 | Sabat, Jr. et al. |
| 2001/0036199 A1 | 11/2001 | Terry |
| 2002/0003645 A1 | 1/2002 | Kim et al. |
| 2002/0009070 A1 | 1/2002 | Lindsay et al. |
| 2002/0012336 A1 | 1/2002 | Hughes et al. |
| 2002/0012495 A1 | 1/2002 | Sasai et al. |
| 2002/0016827 A1 | 2/2002 | McCabe et al. |
| 2002/0045519 A1 | 4/2002 | Watterson et al. |
| 2002/0048071 A1 | 4/2002 | Suzuki et al. |
| 2002/0051434 A1 | 5/2002 | Ozluturk et al. |
| 2002/0075906 A1 | 6/2002 | Cole et al. |
| 2002/0092347 A1 | 7/2002 | Niekerk et al. |
| 2002/0097564 A1 | 7/2002 | Struhsaker et al. |
| 2002/0103012 A1 | 8/2002 | Kim et al. |
| 2002/0111149 A1 | 8/2002 | Shoki |
| 2002/0111192 A1 | 8/2002 | Thomas et al. |
| 2002/0114038 A1 | 8/2002 | Arnon et al. |
| 2002/0123365 A1 | 9/2002 | Thorson et al. |
| 2002/0126967 A1 | 9/2002 | Panak et al. |
| 2002/0128006 A1 * | 9/2002 | Martine ................ G01R 19/145 455/423 |
| 2002/0128009 A1 | 9/2002 | Boch et al. |
| 2002/0130778 A1 | 9/2002 | Nicholson |
| 2002/0181668 A1 | 12/2002 | Masoian et al. |
| 2002/0190845 A1 | 12/2002 | Moore |
| 2002/0197984 A1 | 12/2002 | Monin et al. |
| 2003/0002604 A1 | 1/2003 | Fifield et al. |
| 2003/0007214 A1 | 1/2003 | Aburakawa et al. |
| 2003/0007377 A1 * | 1/2003 | Otaka ................... H03D 7/1425 363/127 |
| 2003/0016418 A1 | 1/2003 | Westbrook et al. |
| 2003/0045284 A1 | 3/2003 | Copley et al. |
| 2003/0069922 A1 | 4/2003 | Arunachalam |
| 2003/0078074 A1 | 4/2003 | Sesay et al. |
| 2003/0112826 A1 | 6/2003 | Ashwood Smith et al. |
| 2003/0141962 A1 | 7/2003 | Barink |
| 2003/0161637 A1 | 8/2003 | Yamamoto et al. |
| 2003/0165287 A1 | 9/2003 | Krill et al. |
| 2003/0174099 A1 | 9/2003 | Bauer et al. |
| 2003/0209601 A1 | 11/2003 | Chung |
| 2004/0001719 A1 | 1/2004 | Sasaki |
| 2004/0008114 A1 | 1/2004 | Sawyer |
| 2004/0017785 A1 | 1/2004 | Zelst |
| 2004/0037565 A1 | 2/2004 | Young et al. |
| 2004/0041714 A1 | 3/2004 | Forster |
| 2004/0043764 A1 | 3/2004 | Bigham et al. |
| 2004/0047313 A1 | 3/2004 | Rumpf et al. |
| 2004/0078151 A1 | 4/2004 | Aljadeff et al. |
| 2004/0095907 A1 | 5/2004 | Agee et al. |
| 2004/0100930 A1 | 5/2004 | Shapira et al. |
| 2004/0106435 A1 | 6/2004 | Bauman et al. |
| 2004/0126068 A1 | 7/2004 | Van Bijsterveld |
| 2004/0126107 A1 | 7/2004 | Jay et al. |
| 2004/0139477 A1 | 7/2004 | Russell et al. |
| 2004/0146020 A1 | 7/2004 | Kubler et al. |
| 2004/0149736 A1 | 8/2004 | Clothier |
| 2004/0151164 A1 | 8/2004 | Kubler et al. |
| 2004/0151503 A1 | 8/2004 | Kashima et al. |
| 2004/0157623 A1 | 8/2004 | Splett |
| 2004/0160912 A1 | 8/2004 | Kubler et al. |
| 2004/0160913 A1 | 8/2004 | Kubler et al. |
| 2004/0162084 A1 | 8/2004 | Wang |
| 2004/0162115 A1 | 8/2004 | Smith et al. |
| 2004/0162116 A1 | 8/2004 | Han et al. |
| 2004/0165573 A1 | 8/2004 | Kubler et al. |
| 2004/0175173 A1 | 9/2004 | Deas |
| 2004/0196404 A1 | 10/2004 | Loheit et al. |
| 2004/0202257 A1 | 10/2004 | Mehta et al. |
| 2004/0203703 A1 | 10/2004 | Fischer |
| 2004/0203704 A1 | 10/2004 | Ommodt et al. |
| 2004/0203846 A1 | 10/2004 | Caronni et al. |
| 2004/0204109 A1 | 10/2004 | Hoppenstein |
| 2004/0208526 A1 | 10/2004 | Mibu |
| 2004/0208643 A1 | 10/2004 | Roberts et al. |
| 2004/0215723 A1 | 10/2004 | Chadha |
| 2004/0218873 A1 | 11/2004 | Nagashima et al. |
| 2004/0233877 A1 | 11/2004 | Lee et al. |
| 2004/0258105 A1 | 12/2004 | Spathas et al. |
| 2004/0267971 A1 | 12/2004 | Seshadri |
| 2005/0003873 A1 | 1/2005 | Naidu et al. |
| 2005/0052287 A1 | 3/2005 | Whitesmith et al. |
| 2005/0058451 A1 | 3/2005 | Ross |
| 2005/0068179 A1 | 3/2005 | Roesner |
| 2005/0076982 A1 | 4/2005 | Metcalf et al. |
| 2005/0078006 A1 | 4/2005 | Hutchins |
| 2005/0093679 A1 | 5/2005 | Zai et al. |
| 2005/0099343 A1 | 5/2005 | Asrani |
| 2005/0116821 A1 | 6/2005 | Wilsey et al. |
| 2005/0123232 A1 | 6/2005 | Piede et al. |
| 2005/0141545 A1 | 6/2005 | Fein et al. |
| 2005/0143077 A1 | 6/2005 | Charbonneau |
| 2005/0147067 A1 | 7/2005 | Mani et al. |
| 2005/0147071 A1 | 7/2005 | Karaoguz et al. |
| 2005/0148306 A1 | 7/2005 | Hiddink |
| 2005/0159108 A1 | 7/2005 | Fletcher |
| 2005/0174236 A1 | 8/2005 | Brookner |
| 2005/0176458 A1 | 8/2005 | Shklarsky et al. |
| 2005/0201323 A1 | 9/2005 | Mani et al. |
| 2005/0201761 A1 | 9/2005 | Bartur et al. |

(56) References Cited

U.S. PATENT DOCUMENTS

| | | |
|---|---|---|
| 2005/0206569 A1* | 9/2005 | Arndt .................... H01Q 1/007 343/700 MS |
| 2005/0219050 A1 | 10/2005 | Martin |
| 2005/0224585 A1 | 10/2005 | Durrant et al. |
| 2005/0226625 A1 | 10/2005 | Wake et al. |
| 2005/0232636 A1 | 10/2005 | Durrant et al. |
| 2005/0242188 A1 | 11/2005 | Vesuna |
| 2005/0246094 A1 | 11/2005 | Moscatiello |
| 2005/0252971 A1 | 11/2005 | Howarth et al. |
| 2005/0266797 A1 | 12/2005 | Utsumi et al. |
| 2005/0266854 A1 | 12/2005 | Niiho et al. |
| 2005/0269930 A1 | 12/2005 | Shimizu et al. |
| 2005/0271396 A1 | 12/2005 | Iannelli |
| 2005/0272439 A1 | 12/2005 | Picciriello et al. |
| 2005/0281213 A1 | 12/2005 | Dohn |
| 2006/0002326 A1 | 1/2006 | Vesuna |
| 2006/0014548 A1 | 1/2006 | Bolin |
| 2006/0017633 A1 | 1/2006 | Pronkine |
| 2006/0028352 A1 | 2/2006 | McNamara et al. |
| 2006/0045054 A1 | 3/2006 | Utsumi et al. |
| 2006/0045524 A1 | 3/2006 | Lee et al. |
| 2006/0045525 A1 | 3/2006 | Lee et al. |
| 2006/0053324 A1 | 3/2006 | Giat et al. |
| 2006/0056327 A1 | 3/2006 | Coersmeier |
| 2006/0062579 A1 | 3/2006 | Kim et al. |
| 2006/0083520 A1 | 4/2006 | Healey et al. |
| 2006/0094470 A1 | 5/2006 | Wake et al. |
| 2006/0104643 A1 | 5/2006 | Lee et al. |
| 2006/0159388 A1 | 7/2006 | Kawase et al. |
| 2006/0172775 A1 | 8/2006 | Conyers et al. |
| 2006/0182446 A1 | 8/2006 | Kim et al. |
| 2006/0182449 A1 | 8/2006 | Iannelli et al. |
| 2006/0189354 A1 | 8/2006 | Lee et al. |
| 2006/0209745 A1 | 9/2006 | MacMullan et al. |
| 2006/0223439 A1 | 10/2006 | Pinel et al. |
| 2006/0233506 A1 | 10/2006 | Noonan et al. |
| 2006/0239630 A1 | 10/2006 | Hase et al. |
| 2006/0268738 A1 | 11/2006 | Goerke et al. |
| 2006/0274704 A1 | 12/2006 | Desai et al. |
| 2007/0009266 A1 | 1/2007 | Bothwell |
| 2007/0050451 A1 | 3/2007 | Caspi et al. |
| 2007/0054682 A1 | 3/2007 | Fanning et al. |
| 2007/0058978 A1 | 3/2007 | Lee et al. |
| 2007/0060045 A1 | 3/2007 | Prautzsch |
| 2007/0060055 A1 | 3/2007 | Desai et al. |
| 2007/0071128 A1 | 3/2007 | Meir et al. |
| 2007/0076649 A1 | 4/2007 | Lin et al. |
| 2007/0093273 A1 | 4/2007 | Cai |
| 2007/0149250 A1 | 6/2007 | Crozzoli et al. |
| 2007/0166042 A1 | 7/2007 | Seeds et al. |
| 2007/0173288 A1 | 7/2007 | Skarby et al. |
| 2007/0174889 A1 | 7/2007 | Kim et al. |
| 2007/0224954 A1 | 9/2007 | Gopi |
| 2007/0230328 A1 | 10/2007 | Saitou |
| 2007/0243899 A1 | 10/2007 | Hermel et al. |
| 2007/0248358 A1 | 10/2007 | Sauer |
| 2007/0253714 A1 | 11/2007 | Seeds et al. |
| 2007/0257796 A1 | 11/2007 | Easton et al. |
| 2007/0264009 A1 | 11/2007 | Sabat, Jr. et al. |
| 2007/0264011 A1 | 11/2007 | Sone et al. |
| 2007/0268846 A1 | 11/2007 | Proctor et al. |
| 2007/0274279 A1 | 11/2007 | Wood et al. |
| 2007/0292143 A1 | 12/2007 | Yu et al. |
| 2007/0297005 A1 | 12/2007 | Montierth et al. |
| 2008/0002652 A1 | 1/2008 | Gupta et al. |
| 2008/0007453 A1 | 1/2008 | Vassilakis et al. |
| 2008/0013909 A1 | 1/2008 | Kostet et al. |
| 2008/0013956 A1 | 1/2008 | Ware et al. |
| 2008/0013957 A1 | 1/2008 | Akers et al. |
| 2008/0014948 A1 | 1/2008 | Scheinert |
| 2008/0026765 A1 | 1/2008 | Charbonneau |
| 2008/0031628 A1 | 2/2008 | Dragas et al. |
| 2008/0043714 A1 | 2/2008 | Pernu |
| 2008/0056167 A1 | 3/2008 | Kim et al. |
| 2008/0058018 A1* | 3/2008 | Scheinert ........... H04B 7/15528 455/562.1 |
| 2008/0063397 A1 | 3/2008 | Hu et al. |
| 2008/0070502 A1 | 3/2008 | George et al. |
| 2008/0080863 A1 | 4/2008 | Sauer et al. |
| 2008/0098203 A1 | 4/2008 | Master et al. |
| 2008/0118014 A1 | 5/2008 | Reunamaki et al. |
| 2008/0119198 A1 | 5/2008 | Hettstedt et al. |
| 2008/0124086 A1 | 5/2008 | Matthews |
| 2008/0124087 A1 | 5/2008 | Hartmann et al. |
| 2008/0129634 A1 | 6/2008 | Pera et al. |
| 2008/0134194 A1 | 6/2008 | Liu |
| 2008/0145061 A1 | 6/2008 | Lee et al. |
| 2008/0150514 A1 | 6/2008 | Codreanu et al. |
| 2008/0166094 A1 | 7/2008 | Bookbinder et al. |
| 2008/0194226 A1 | 8/2008 | Rivas et al. |
| 2008/0207253 A1 | 8/2008 | Jaakkola et al. |
| 2008/0212969 A1 | 9/2008 | Fasshauer et al. |
| 2008/0219670 A1 | 9/2008 | Kim et al. |
| 2008/0232305 A1 | 9/2008 | Oren et al. |
| 2008/0232799 A1 | 9/2008 | Kim |
| 2008/0247716 A1 | 10/2008 | Thomas |
| 2008/0253280 A1 | 10/2008 | Tang et al. |
| 2008/0253351 A1 | 10/2008 | Pernu et al. |
| 2008/0253773 A1 | 10/2008 | Zheng |
| 2008/0260388 A1 | 10/2008 | Kim et al. |
| 2008/0261656 A1 | 10/2008 | Bella et al. |
| 2008/0268766 A1 | 10/2008 | Narkmon et al. |
| 2008/0268833 A1 | 10/2008 | Huang et al. |
| 2008/0273844 A1 | 11/2008 | Kewitsch |
| 2008/0279137 A1 | 11/2008 | Pernu et al. |
| 2008/0280569 A1 | 11/2008 | Hazani et al. |
| 2008/0291830 A1 | 11/2008 | Pernu et al. |
| 2008/0292322 A1 | 11/2008 | Daghighian et al. |
| 2008/0298813 A1 | 12/2008 | Song et al. |
| 2008/0304831 A1 | 12/2008 | Miller, II et al. |
| 2008/0310464 A1 | 12/2008 | Schneider |
| 2008/0310848 A1 | 12/2008 | Yasuda et al. |
| 2008/0311876 A1 | 12/2008 | Leenaerts et al. |
| 2008/0311944 A1 | 12/2008 | Hansen et al. |
| 2009/0022304 A1 | 1/2009 | Kubler et al. |
| 2009/0028087 A1 | 1/2009 | Nguyen et al. |
| 2009/0028317 A1 | 1/2009 | Ling et al. |
| 2009/0041413 A1 | 2/2009 | Hurley |
| 2009/0047023 A1 | 2/2009 | Pescod et al. |
| 2009/0059903 A1 | 3/2009 | Kubler et al. |
| 2009/0061796 A1 | 3/2009 | Arkko et al. |
| 2009/0061939 A1 | 3/2009 | Andersson et al. |
| 2009/0073916 A1 | 3/2009 | Zhang et al. |
| 2009/0081985 A1 | 3/2009 | Rofougaran et al. |
| 2009/0087179 A1 | 4/2009 | Underwood et al. |
| 2009/0088071 A1 | 4/2009 | Rofougaran |
| 2009/0088072 A1 | 4/2009 | Rofougaran et al. |
| 2009/0135078 A1 | 5/2009 | Lindmark et al. |
| 2009/0141780 A1 | 6/2009 | Cruz-Albrecht et al. |
| 2009/0149221 A1 | 6/2009 | Liu et al. |
| 2009/0154621 A1 | 6/2009 | Shapira et al. |
| 2009/0169163 A1 | 7/2009 | Abbott, III et al. |
| 2009/0175214 A1 | 7/2009 | Sfar et al. |
| 2009/0180407 A1 | 7/2009 | Sabat et al. |
| 2009/0180426 A1 | 7/2009 | Sabat et al. |
| 2009/0216449 A1 | 8/2009 | Erko et al. |
| 2009/0218407 A1 | 9/2009 | Rofougaran |
| 2009/0218657 A1 | 9/2009 | Rofougaran |
| 2009/0237317 A1 | 9/2009 | Rofougaran |
| 2009/0245084 A1 | 10/2009 | Moffatt et al. |
| 2009/0245153 A1 | 10/2009 | Li et al. |
| 2009/0245221 A1 | 10/2009 | Piipponen |
| 2009/0247109 A1 | 10/2009 | Rofougaran |
| 2009/0252136 A1 | 10/2009 | Mahany et al. |
| 2009/0252139 A1 | 10/2009 | Ludovico et al. |
| 2009/0252205 A1 | 10/2009 | Rheinfelder et al. |
| 2009/0258652 A1 | 10/2009 | Lambert et al. |
| 2009/0278596 A1 | 11/2009 | Rofougaran et al. |
| 2009/0279593 A1 | 11/2009 | Rofougaran et al. |
| 2009/0285147 A1 | 11/2009 | Subasic et al. |
| 2009/0316608 A1 | 12/2009 | Singh et al. |
| 2009/0319909 A1 | 12/2009 | Hsueh et al. |
| 2010/0002626 A1 | 1/2010 | Schmidt et al. |

(56) References Cited

U.S. PATENT DOCUMENTS

| | | |
|---|---|---|
| 2010/0002661 A1 | 1/2010 | Schmidt et al. |
| 2010/0002662 A1 | 1/2010 | Schmidt et al. |
| 2010/0014494 A1 | 1/2010 | Schmidt et al. |
| 2010/0027443 A1 | 2/2010 | LoGalbo et al. |
| 2010/0056200 A1 | 3/2010 | Tolonen |
| 2010/0080154 A1 | 4/2010 | Noh et al. |
| 2010/0080182 A1 | 4/2010 | Kubler et al. |
| 2010/0091475 A1 | 4/2010 | Toms et al. |
| 2010/0118864 A1 | 5/2010 | Kubler et al. |
| 2010/0127937 A1 | 5/2010 | Chandrasekaran et al. |
| 2010/0134257 A1 | 6/2010 | Puleston et al. |
| 2010/0142598 A1 | 6/2010 | Murray et al. |
| 2010/0142955 A1 | 6/2010 | Yu et al. |
| 2010/0144285 A1 | 6/2010 | Behzad et al. |
| 2010/0148373 A1 | 6/2010 | Chandrasekaran |
| 2010/0156721 A1 | 6/2010 | Alamouti et al. |
| 2010/0159859 A1 | 6/2010 | Rofougaran |
| 2010/0176962 A1 | 7/2010 | Yossef |
| 2010/0188998 A1 | 7/2010 | Pernu et al. |
| 2010/0189439 A1 | 7/2010 | Novak et al. |
| 2010/0190509 A1 | 7/2010 | Davis |
| 2010/0202326 A1 | 8/2010 | Rofougaran et al. |
| 2010/0225413 A1 | 9/2010 | Rofougaran et al. |
| 2010/0225520 A1 | 9/2010 | Mohamadi et al. |
| 2010/0225556 A1 | 9/2010 | Rofougaran et al. |
| 2010/0225557 A1 | 9/2010 | Rofougaran et al. |
| 2010/0232323 A1 | 9/2010 | Kubler et al. |
| 2010/0246558 A1 | 9/2010 | Harel |
| 2010/0255774 A1 | 10/2010 | Kenington |
| 2010/0258949 A1 | 10/2010 | Henderson et al. |
| 2010/0260063 A1 | 10/2010 | Kubler et al. |
| 2010/0261501 A1 | 10/2010 | Behzad et al. |
| 2010/0266287 A1 | 10/2010 | Adhikari et al. |
| 2010/0278530 A1 | 11/2010 | Kummetz et al. |
| 2010/0284323 A1 | 11/2010 | Tang et al. |
| 2010/0290355 A1 | 11/2010 | Roy et al. |
| 2010/0309049 A1 | 12/2010 | Reunamaki et al. |
| 2010/0311472 A1 | 12/2010 | Rofougaran et al. |
| 2010/0311480 A1 | 12/2010 | Raines et al. |
| 2010/0329161 A1 | 12/2010 | Ylanen et al. |
| 2010/0329166 A1 | 12/2010 | Mahany et al. |
| 2010/0329680 A1 | 12/2010 | Presi et al. |
| 2011/0002687 A1 | 1/2011 | Sabat, Jr. et al. |
| 2011/0007724 A1 | 1/2011 | Mahany et al. |
| 2011/0007733 A1 | 1/2011 | Kubler et al. |
| 2011/0008042 A1 | 1/2011 | Stewart |
| 2011/0019999 A1 | 1/2011 | George et al. |
| 2011/0021146 A1 | 1/2011 | Pernu |
| 2011/0021224 A1 | 1/2011 | Koskinen et al. |
| 2011/0026932 A1 | 2/2011 | Yeh et al. |
| 2011/0045767 A1 | 2/2011 | Rofougaran et al. |
| 2011/0065450 A1 | 3/2011 | Kazmi |
| 2011/0066774 A1 | 3/2011 | Rofougaran |
| 2011/0069668 A1 | 3/2011 | Chion et al. |
| 2011/0071734 A1 | 3/2011 | Van Wiemeersch et al. |
| 2011/0086614 A1 | 4/2011 | Brisebois et al. |
| 2011/0116393 A1 | 5/2011 | Hong et al. |
| 2011/0116572 A1 | 5/2011 | Lee et al. |
| 2011/0122912 A1 | 5/2011 | Benjamin et al. |
| 2011/0126071 A1 | 5/2011 | Han et al. |
| 2011/0149879 A1 | 6/2011 | Noriega et al. |
| 2011/0158298 A1 | 6/2011 | Djadi et al. |
| 2011/0182230 A1 | 7/2011 | Ohm et al. |
| 2011/0194475 A1 | 8/2011 | Kim et al. |
| 2011/0200328 A1 | 8/2011 | In De Betou et al. |
| 2011/0201368 A1 | 8/2011 | Faccin et al. |
| 2011/0204504 A1 | 8/2011 | Henderson et al. |
| 2011/0206383 A1 | 8/2011 | Chien et al. |
| 2011/0211439 A1 | 9/2011 | Manpuria et al. |
| 2011/0215901 A1 | 9/2011 | Van Wiemeersch et al. |
| 2011/0222415 A1 | 9/2011 | Ramamurthi et al. |
| 2011/0222434 A1 | 9/2011 | Chen |
| 2011/0222619 A1 | 9/2011 | Ramamurthi et al. |
| 2011/0227795 A1 | 9/2011 | Lopez et al. |
| 2011/0244887 A1 | 10/2011 | Dupray et al. |
| 2011/0256878 A1 | 10/2011 | Zhu et al. |
| 2011/0268033 A1 | 11/2011 | Boldi et al. |
| 2011/0274021 A1 | 11/2011 | He et al. |
| 2011/0281536 A1 | 11/2011 | Lee et al. |
| 2012/0052892 A1 | 3/2012 | Braithwaite |
| 2012/0134666 A1 | 5/2012 | Casterline et al. |
| 2012/0134673 A1 | 5/2012 | Palanisamy et al. |
| 2012/0177026 A1 | 7/2012 | Uyehara et al. |
| 2013/0012195 A1 | 1/2013 | Sabat, Jr. et al. |
| 2013/0033325 A1* | 2/2013 | Ladhani ............ H03F 1/0288 330/277 |
| 2013/0070816 A1 | 3/2013 | Aoki et al. |
| 2013/0071112 A1 | 3/2013 | Melester et al. |
| 2013/0089332 A1 | 4/2013 | Sauer et al. |
| 2013/0095870 A1 | 4/2013 | Phillips et al. |
| 2013/0116922 A1 | 5/2013 | Cai et al. |
| 2013/0131972 A1 | 5/2013 | Kumar et al. |
| 2013/0210490 A1 | 8/2013 | Fischer et al. |
| 2013/0252651 A1 | 9/2013 | Zavadsky et al. |
| 2013/0260705 A1 | 10/2013 | Stratford |
| 2013/0303089 A1 | 11/2013 | Wang et al. |
| 2013/0314210 A1 | 11/2013 | Schoner et al. |
| 2014/0016583 A1 | 1/2014 | Smith |
| 2014/0140225 A1 | 5/2014 | Wala |
| 2014/0146797 A1 | 5/2014 | Zavadsky et al. |
| 2014/0146905 A1 | 5/2014 | Zavadsky et al. |
| 2014/0146906 A1 | 5/2014 | Zavadsky et al. |
| 2014/0153918 A1 | 6/2014 | Hazani |
| 2014/0219140 A1 | 8/2014 | Uyehara et al. |
| 2015/0244562 A1 | 8/2015 | Hanson et al. |
| 2016/0135184 A1 | 5/2016 | Zavadsky et al. |
| 2017/0054496 A1 | 2/2017 | Hazani |

FOREIGN PATENT DOCUMENTS

| | | |
|---|---|---|
| CA | 2065090 C | 2/1998 |
| CA | 2242707 A1 | 1/1999 |
| CN | 101389148 A | 3/2009 |
| CN | 101547447 A | 9/2009 |
| DE | 20104862 U1 | 8/2001 |
| DE | 10249414 A1 | 5/2004 |
| EP | 0477952 A2 | 4/1992 |
| EP | 0477952 A3 | 4/1992 |
| EP | 0664621 A1 | 7/1995 |
| EP | 0461583 B1 | 3/1997 |
| EP | 851618 A2 | 7/1998 |
| EP | 0687400 B1 | 11/1998 |
| EP | 0993124 A2 | 4/2000 |
| EP | 1037411 A2 | 9/2000 |
| EP | 1179895 A1 | 2/2002 |
| EP | 1267447 A1 | 12/2002 |
| EP | 1347584 A2 | 9/2003 |
| EP | 1363352 A1 | 11/2003 |
| EP | 1391897 A1 | 2/2004 |
| EP | 1443687 A1 | 8/2004 |
| EP | 1455550 A2 | 9/2004 |
| EP | 1501206 A1 | 1/2005 |
| EP | 1503451 A1 | 2/2005 |
| EP | 1530316 A1 | 5/2005 |
| EP | 1511203 B1 | 3/2006 |
| EP | 1267447 B1 | 8/2006 |
| EP | 1693974 A1 | 8/2006 |
| EP | 1742388 A1 | 1/2007 |
| EP | 1227605 B1 | 1/2008 |
| EP | 1954019 A1 | 8/2008 |
| EP | 1968250 A1 | 9/2008 |
| EP | 1056226 B1 | 4/2009 |
| EP | 1357683 B1 | 5/2009 |
| EP | 2276298 A1 | 1/2011 |
| EP | 1570626 B1 | 11/2013 |
| GB | 2323252 A | 9/1998 |
| GB | 2370170 A | 6/2002 |
| GB | 2399963 A | 9/2004 |
| GB | 2428149 A | 1/2007 |
| JP | H4189036 A | 7/1992 |
| JP | 05260018 A | 10/1993 |
| JP | 09083450 A | 3/1997 |
| JP | 09162810 A | 6/1997 |
| JP | 09200840 A | 7/1997 |

(56) References Cited

FOREIGN PATENT DOCUMENTS

| | | |
|---|---|---|
| JP | 11068675 A | 3/1999 |
| JP | 2000152300 A | 5/2000 |
| JP | 2000341744 A | 12/2000 |
| JP | 2002264617 A | 9/2002 |
| JP | 2002353813 A | 12/2002 |
| JP | 2003148653 A | 5/2003 |
| JP | 2003172827 A | 6/2003 |
| JP | 2004172734 A | 6/2004 |
| JP | 2004245963 A | 9/2004 |
| JP | 2004247090 A | 9/2004 |
| JP | 2004264901 A | 9/2004 |
| JP | 2004265624 A | 9/2004 |
| JP | 2004317737 A | 11/2004 |
| JP | 2004349184 A | 12/2004 |
| JP | 2005018175 A | 1/2005 |
| JP | 2005087135 A | 4/2005 |
| JP | 2005134125 A | 5/2005 |
| JP | 2007228603 A | 9/2007 |
| JP | 2008172597 A | 7/2008 |
| KR | 20010055088 A | 7/2001 |
| WO | 9603823 A1 | 2/1996 |
| WO | 9810600 A1 | 3/1998 |
| WO | 00042721 A1 | 7/2000 |
| WO | 0072475 A1 | 11/2000 |
| WO | 0178434 A1 | 10/2001 |
| WO | 0180596 A1 | 10/2001 |
| WO | 2001080596 A1 | 10/2001 |
| WO | 0184760 A1 | 11/2001 |
| WO | 0221183 A1 | 3/2002 |
| WO | 0230141 A1 | 4/2002 |
| WO | 02102102 A1 | 12/2002 |
| WO | 03024027 A1 | 3/2003 |
| WO | 03098175 A1 | 11/2003 |
| WO | 2004030154 A2 | 4/2004 |
| WO | 2004047472 A1 | 6/2004 |
| WO | 2004056019 A1 | 7/2004 |
| WO | 2004059934 A1 | 7/2004 |
| WO | 2004086795 A2 | 10/2004 |
| WO | 2004093471 A2 | 10/2004 |
| WO | 2005062505 A1 | 7/2005 |
| WO | 2005069203 A2 | 7/2005 |
| WO | 2005073897 A1 | 8/2005 |
| WO | 2005079386 A2 | 9/2005 |
| WO | 2005101701 A2 | 10/2005 |
| WO | 2005111959 A2 | 11/2005 |
| WO | 2006011778 A1 | 2/2006 |
| WO | 2006018592 A1 | 2/2006 |
| WO | 2006019392 A1 | 2/2006 |
| WO | 2006039941 A1 | 4/2006 |
| WO | 2006051262 A1 | 5/2006 |
| WO | 2006060754 A2 | 6/2006 |
| WO | 2006077569 A1 | 7/2006 |
| WO | 2006105185 A2 | 10/2006 |
| WO | 2006133609 A1 | 12/2006 |
| WO | 2006136811 A1 | 12/2006 |
| WO | 2007048427 A1 | 5/2007 |
| WO | 2007077451 A1 | 7/2007 |
| WO | 2007088561 A1 | 8/2007 |
| WO | 2007091026 A1 | 8/2007 |
| WO | 2008008249 A2 | 1/2008 |
| WO | 2008027213 A2 | 3/2008 |
| WO | 2008033298 A2 | 3/2008 |
| WO | 2008039830 A2 | 4/2008 |
| WO | 2008116014 A2 | 9/2008 |
| WO | 2006046088 A1 | 5/2009 |
| WO | 2010090999 A1 | 8/2010 |
| WO | 2010132739 A1 | 11/2010 |
| WO | 2011023592 A1 | 3/2011 |
| WO | 2011100095 A1 | 8/2011 |
| WO | 2011139939 A1 | 11/2011 |
| WO | 2012148938 A1 | 11/2012 |
| WO | 2012148940 A1 | 11/2012 |
| WO | 2013122915 A1 | 8/2013 |
| WO | 2014040608 A1 | 3/2014 |

OTHER PUBLICATIONS

Seto et al., "Optical Subcarrier Multiplexing Transmission for Base Station With Adaptive Array Antenna," IEEE Transactions on Microwave Theory and Techniques, vol. 49, No. 10, Oct. 2001, pp. 2036-2041.

Biton et al., "Challenge: CeTV and Ca-Fi—Cellular and Wi-Fi over CATV," Proceedings of the Eleventh Annual International Conference on Mobile Computing and Networking, Aug. 28-Sep. 2, 2005, Cologne, Germany, Association for Computing Machinery, 8 pages.

Author Unknown, "Fiber Optic Distributed Antenna System," Installation and Users Guide, ERAU Version 1.5, May 2002, Andrews Corporation, 53 pages.

International Search Report for PCT/IL013/050966, dated Apr. 4, 2014, 4 pages.

Non-Final Office Action for U.S. Appl. No. 14/086,491, dated Aug. 21, 2015, 21 pages.

Non-Final Office Action for U.S. Appl. No. 14/086,491, dated Nov. 10, 2016, 29 pages.

Notice of Allowance for U.S. Appl. No. 14/086,491, dated Mar. 13, 2017, 8 pages.

Advisory Action for U.S. Appl. No. 14/086,491, dated Jun. 27, 2016, 3 pages.

Final Office Action for U.S. Appl. No. 14/086.491, dated Apr. 18, 2016, 26 pages.

Non-Final Office Action for U.S. Appl. No. 14/887,868, dated Apr. 7, 2017, 13 pages.

Patent Cooperation Treaty, International Search Report for PCT/IL2013/050966 dated Apr. 4, 2014, 4 pages.

Advisory Action for U.S. Appl. No. 14/867,868, dated Mar. 1, 2018, 3 pages.

Arredondo, Albedo et al., "Techniques for Improving In-Building Radio Coverage Using Fiber-Fed Distributed Antenna Networks," IEEE 46th Vehicular Technology Conference, Atlanta, Georgia, Apr. 28-May 1, 1996, pp. 1540-1543, vol. 3.

Bakaul, M., et al., "Efficient Multiplexing Scheme for Wavelength-Interleaved DWDM Millimeter-Wave Fiber-Radio Systems," IEEE Photonics Technology Letters, Dec. 2005, vol. 17, No. 12, pp. 2718-2720.

Cho, Bong Youl et al. "The Forward Link Performance of a PCS System with an AGC," 4th CDMA International Conference and Exhibition, "The Realization of IMT-2000," 1999, 10 pages.

Chu, Ta-Shing et al. "Fiber optic microcellular radio", IEEE Transactions on Vehicular Technology, Aug. 1991, pp. 599-606, vol. 40, Issue 3.

Cooper, A.J., "Fiber/Radio for the Provision of Cordless/Mobile Telephony Services in the Access Network," Electronics Letters, 1990, pp. 2054-2056, vol. 26.

Cutrer, David M. et al., "Dynamic Range Requirements for Optical Transmitters in Fiber-Fed Microcellular Networks," IEEE Photonics Technology Letters, May 1995, pp. 564-566, vol. 7, No. 5.

Dolmans, G. et al. "Performance study of an adaptive dual antenna handset for indoor communications", IEE Proceedings: Microwaves, Antennas and Propagation, Apr. 1999, pp. 138-144, vol. 146, Issue 2.

Ellinger, Frank et al., "A 5.2 GHz variable gain LNA MMIC for adaptive antenna combining", IEEE MTT-S International Microwave Symposium Digest, Anaheim, California, Jun. 13-19, 1999, pp. 501-504, vol. 2.

Fan, J.C. et al., "Dynamic range requirements for microcellular personal communication systems using analog fiber-optic links", IEEE Transactions on Microwave Theory and Techniques, Aug. 1997, pp. 1390-1397, vol. 45, Issue 8.

Gibson, B.C., et al., "Evanescent Field Analysis of Air-Silica Microstructure Waveguides," The 14th Annual Meeting of the IEEE Lasers and Electro-Optics Society, 1-7803-7104-4/01, Nov. 12-13, 2001, vol. 2, pp. 709-710.

Huang, C., et al., "A WLAN-Used Helical Antenna Fully Integrated with the PCMCIA Carrier," IEEE Transactions on Antennas and Propagation, Dec. 2005, vol. 53, No. 12, pp. 4164-4168.

(56) References Cited

OTHER PUBLICATIONS

Kojucharow, K., et al., "Millimeter-Wave Signal Properties Resulting from Electrooptical Upconversion," IEEE Transaction on Microwave Theory and Techniques, Oct. 2001, vol. 49, No. 10, pp. 1977-1985.
Monro, T.M., et al., "Holey Fibers with Random Cladding Distributions," Optics Letters, Feb. 15, 2000, vol. 25, No. 4, pp. 206-208.
Moreira, J.D., et al., "Diversity Techniques for OFDM Based WLAN Systems," The 13th IEEE International Symposium on Personal, Indoor and Mobile Radio Communications, Sep. 15-18, 2002, vol. 3, pp. 1008-1011.
Niiho, T., et al., "Multi-Channel Wireless LAN Distributed Antenna System Based on Radio-Over-Fiber Techniques," The 17th Annual Meeting of the IEEE Lasers and Electro-Optics Society, Nov. 2004, vol. 1, pp. 57-58.
Author Unknown, "ITU-T G.652, Telecommunication Standardization Sector of ITU, Series G: Transmission Systems and Media, Digital Systems and Networks, Transmission Media and Optical Systems Characteristics—Optical Fibre Cables, Characteristics of a Single-Mode Optical Fiber and Cable," ITU-T Recommendation G.652, International Telecommunication Union, Jun. 2005, 22 pages.
Author Unknown, "ITU-T G.657, Telecommunication Standardization Sector of ITU, Dec. 2006, Series G: Transmission Systems and Media, Digital Systems and Networks, Transmission Media and Optical Systems Characteristics—Optical Fibre Cables, Characteristics of a Bending Loss Insensitive Single Mode Optical Fibre and Cable for the Access Network," ITU-T Recommendation G.657, International Telecommunication Union, 20 pages.
Chowdhury et al., "Multi-service Multi-carrier Broadband MIMO Distributed Antenna Systems for In-building Optical Wireless Access," Presented at the 2010 Conference on Optical Fiber Communication and National Fiber Optic Engineers Conference, Mar. 21-25, 2010, San Diego, California, IEEE, pp. 1-3.
Opatic, D., "Radio over Fiber Technology for Wireless Access," Ericsson, Oct. 17, 2009, 6 pages.
Paulraj, A.J., et al., "An Overview of Mimo Communications—A Key to Gigabit Wireless," Proceedings of the IEEE, Feb. 2004, vol. 92, No. 2, 34 pages.
Pickrell, G.R., et al., "Novel Techniques for the Fabrication of Holey Optical Fibers," Proceedings of SPIE, Oct. 28-Nov. 2, 2001, vol. 4578, 2001, pp. 271-282.
Roh, W., et al., "MIMO Channel Capacity for the Distributed Antenna Systems," Proceedings of the 56th IEEE Vehicular Technology Conference, Sep. 2002, vol. 2, pp. 706-709.
Schweber, Bill, "Maintaining cellular connectivity indoors demands sophisticated design," EDN Network, Dec. 21, 2000, 2 pages, http://www.edn.com/design/integrated-circuit-design/4362776/Maintaining-cellular-connectivity-indoors-demands-sophisticated-design.
Seto, I., et al., "Antenna-Selective Transmit Diversity Technique for OFDM-Based WLANs with Dual-Band Printed Antennas," 2005 IEEE Wireless Communications and Networking Conference, Mar. 13-17, 2005, vol. 1, pp. 51-56.
Shen, C., et al., "Comparison of Channel Capacity for MIMO-DAS versus MIMO-CAS," The 9th Asia-Pacific Conference on Communications, Sep. 21-24, 2003, vol. 1, pp. 113-118.
Wake, D. et al., "Passive Picocell: A New Concept n Wireless Network Infrastructure," Electronics Letters, Feb. 27, 1997, vol. 33, No. 5, pp. 404-406.

Windyka, John et al., "System-Level Integrated Circuit (SLIC) Technology Development for Phased Array Antenna Applications," Contractor Report 204132, National Aeronautics and Space Administration, Jul. 1997, 94 pages.
Winters, J., et al., "The Impact of Antenna Diversity on the Capacity of Wireless Communications Systems," IEEE Transcations on Communications, vol. 42, No. 2/3/4, Feb./Mar./Apr. 1994, pp. 1740-1751.
Yu et al., "A Novel Scheme to Generate Single-Sideband Millimeter-Wave Signals by Using Low-Frequency Local Oscillator Signal," IEEE Photonics Technology Letters, vol. 20, No. 7, Apr. 1, 2008, pp. 478-480.
Attygalle et al., "Extending Optical Transmission Distance in Fiber Wireless Links Using Passive Filtering in Conjunction with Optimized Modulation," Journal of Lightwave Technology, vol. 24, No. 4, Apr. 2006, 7 pages.
Bo Zhang et al., "Reconfigurable Multifunctional Operation Using Optical Injection-Locked Vertical-Cavity Surface-Emitting Lasers," Journal of Lightwave Technology, vol. 27, No. 15, Aug. 2009, 6 pages.
Chang-Hasnain, et al., "Ultrahigh-speed laser modulation by injection locking," Chapter 6, Optical Fiber Telecommunication V A: Components and Subsystems, Elsevier Inc., 2008, 20 pages.
Cheng Zhang et al., "60 GHz Millimeter-wave Generation by Two-mode Injection-locked Fabry-Perot Laser Using Second-Order Sideband Injection in Radio-over-Fiber System," Conference on Lasers and Electro-Optics and Quantum Electronics, Optical Society of America, May 2008, 2 pages.
Chrostowski, "Optical Injection Locking of Vertical Cavity Surface Emitting Lasers," Fall 2003, PhD dissertation University of California at Berkely, 122 pages.
Dang et al., "Radio-over-Fiber based architecture for seamless wireless indoor communication in the 60GHz band," Computer Communications, Elsevier B.V., Amsterdam, NL, vol. 30, Sep. 8, 2007, pp. 3598-3613.
Hyuk-Kee Sung et al., "Optical Single Sideband Modulation Using Strong Optical Injection-Locked Semiconductor Lasers," IEEE Photonics Technology Letters, vol. 19, No. 13, Jul. 1, 2007, 4 pages.
Lim et al., "Analysis of Optical Carrier-to-Sideband Ratio for Improving Transmission Performance in Fiber-Radio Links," IEEE Transactions of Microwave Theory and Techniques, vol. 54, No. 5, May 2006, 7 pages.
Lu H H et al., "Improvement of radio-on-multimode fiber systems based on light injection and optoelectronic feedback techniques," Optics Communications, vol. 266, No. 2, Elsevier B.V., Oct. 15, 2006, 4 pages.
Pleros et al., "A 60 GHz Radio-Over-Fiber Network Architecture for Seamless Communication With High Mobility," Journal of Lightwave Technology, vol. 27, No. 12, IEEE, Jun. 15, 2009, pp. 1957-1967.
Reza et al., "Degree-of-Polarization-Based PMD Monitoring for Subcarrier-Multiplexed Signals via Equalized Carrier/Sideband Filtering," Journal of Lightwave Technology, vol. 22, No. 4, IEEE, Apr. 2004, 8 pages.
Zhao, "Optical Injection Locking on Vertical-Cavity Surface-Emitting Lasers (VCSELs): Physics and Applications," Fall 2008, PhD dissertation University of California at Berkeley, pp. 1-209.
Author Unknown, "VCSEL Chaotic Synchronization and Modulation Characteristics," Master's Thesis, Southwest Jiatong University, Professor Pan Wei, Apr. 2006, 8 pages (machine translation).

* cited by examiner

CABLING CONNECTIVITY MONITORING AND VERIFICATION

CROSS-REFERENCE TO RELATED APPLICATIONS

This application is a continuation of U.S. application Ser. No. 14/086491, now U.S. Pat. No. 9,647,758, filed on Nov. 21, 2013, which claims the benefit of priority under 35 U.S.C. § 119 of U.S. Provisional Application Ser. No. 61/731,826, filed on Nov. 30, 2012, both applications being relied upon and incorporated herein by reference in their entireties.

BACKGROUND

Field of the Disclosure

The disclosure relates generally to wireless infrastructures for distributing radio frequency (RF) signals, and more particularly to methods, circuits, and systems for cable connectivity monitoring and verification which may be used in determining whether cables in a RF system are properly connected.

Technical Background

Wireless communication is rapidly growing, with ever-increasing demands for high-speed mobile data communication. Wireless infrastructures, such as distributed antenna systems (or "DAS") communicate with wireless devices called "clients," which must reside within the wireless range or "cell coverage area" in order to communicate with an access point device and to provide high-speed data communications.

One approach to deploying a distributed antenna system involves the use of RF antenna coverage areas, also referred to as "antenna coverage areas," or simply "coverage areas." The antenna coverage areas are provided by remote antenna units in the distributed antenna system. Remote antenna units generally provide antenna coverage areas having radii in the range from a few meters up to twenty (20) meters in indoor applications.

If the antenna coverage areas provided each cover a small area, there are typically only a few users (e.g. persons, or clients) per antenna coverage area. This allows for minimizing the amount of RF bandwidth shared among the wireless system users. The use of optical fiber to distribute RF communications signals to provide an optical fiber-based distributed antenna system, such as by Radio-over-Fiber (RoF) distribution for increased bandwidth.

Radio Frequency (RF) systems include in many cases multiple cables connecting between various boards, modules, or subsystems. The cables are usually connected by the use of either thread or snap based connectors. During installation, it is important to verify that the right ports are connected, and during the on-going operation it is important that reliable connections are maintained. Installations of conventional DAS systems are typically labor-intensive, and during normal operation, cables may become disconnected or require a change in connection between various components. Manual checking and verification of cable connections adds to the cost of maintaining such systems.

SUMMARY OF THE DETAILED DESCRIPTION

Embodiments disclosed in the detailed description include methods for cabling connectivity and verification, and related apparatuses and systems. One embodiment of the disclosure relates to a method of testing a system having a plurality of components. Each component in the plurality of components has at least one port. A plurality of cables is connected to one or more of the at least one port of one or more of the plurality of components. The method comprises applying a first logic state to a first port of a first of the components. The method further comprises scanning multiple input ports of the system. The method also comprises recording a link corresponding to the applied first logic state at the first port of the first component.

Additional embodiments of the disclosure relate to test systems for testing a communication system having a plurality of components, each component having at least one port, and a plurality of cables connected to one or more of the components ports. In one embodiment, the test system comprises a first component. The first component comprises at least one port, at least one capacitor, and at least one resistor for providing high impedance. The test system also comprises a controller. The controller is configured to provide a first logic state to the at least one port of the first component. The controller is also configured to scan multiple input ports of the system. Further, the controller is configured to record a link corresponding to the applied first logic state at the first port of the first component.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Reference will now be made in detail to the embodiments, examples of which are illustrated in the accompanying drawings, in which some, but not all embodiments are shown. Whenever possible, like reference numbers will be used to refer to like components or parts. Embodiments disclosed in the detailed description include methods for cabling connectivity and verification, and related apparatuses and systems. One embodiment of the disclosure relates to a method of testing a system having a plurality of components. Each component in the plurality of components has at least one port. A plurality of cables is connected to one or more of the at least one port of one or more of the plurality of components. The method comprises applying a first logic state to a first port of a first of the components. The method further comprises scanning multiple input ports of the system. The method also comprises recording a link corresponding to the applied first logic state at the first port of the first component.

Additional embodiments of the disclosure relates to test systems for testing a communication system having a plurality of components, each component having at least one port, and a plurality of cables connected to one or more of the components ports. In one embodiment, the test system comprises a first component. The first component comprises at least one port, at least one capacitor, and at least one resistor for providing high impedance. The test system also comprises a controller. The controller is configured to provide a first logic state to the at least one port of the first component. The controller is also configured to scan multiple input ports of the system. Further, the controller is configured to record a link corresponding to the applied first logic state at the first port of the first component.

Before discussing systems and methods for monitoring connectivity starting at FIG. 4, wireless infrastructures and related components and methods that support such applications in DAS are discussed with reference to FIGS. 1-3.

Figure 1:
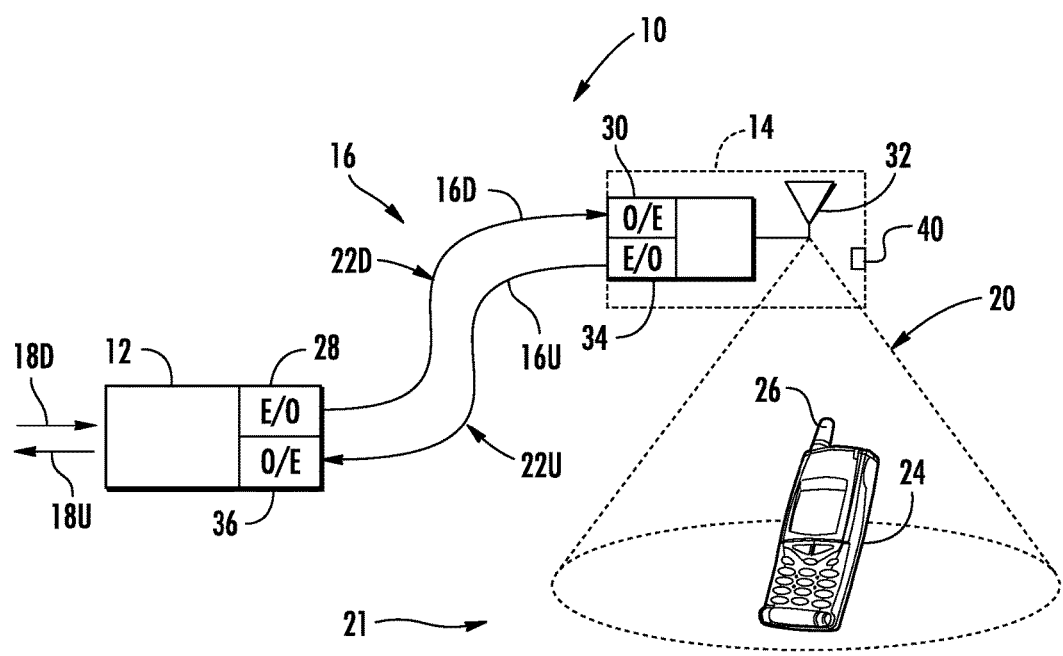
FIG. 1 is a schematic diagram of an exemplary optical fiber-based wireless infrastructure.

FIG. 1 is a schematic diagram of an embodiment of an optical fiber-based distributed antenna system, or "DAS". In this embodiment, the system is an optical fiber-based DAS 10 that is configured to create one or more antenna coverage areas for establishing communications with wireless client devices located in the RF range of the antenna coverage areas. The DAS 10 provides RF communications services (e.g., cellular services). In this embodiment, the DAS 10 includes head-end equipment in the form of a head-end unit (HEU) 12, one or more remote antenna units (RAUs) 14, and one or more optical fibers 16 that optically couples the HEU 12 to the RAU 14. The HEU 12 is configured to receive communications over downlink electrical RF communications signals 18D from a source or sources, such as a network or carrier as examples, and provide such communications to the RAU 14. The HEU 12 is also configured to return communications received from the RAU 14, via uplink electrical RF communications signals 18U, back to the source or sources. In this regard in this embodiment, the optical fiber 16 includes at least one downlink optical fiber 16D to carry signals communicated from the HEU 12 to the RAU 14 and at least one uplink optical fiber 16U to carry signals communicated from the RAU 14 back to the HEU 12.

The antenna coverage area 20 of the RAU 14 forms an RF coverage area 21 substantially centered about the RAU 14. The HEU 12 is adapted to perform or to facilitate any one of a number of wireless applications, including but not limited to Radio-over-Fiber (RoF), radio frequency identification (RFID), wireless local-area network (WLAN) communication, public safety, cellular, telemetry, and other mobile or fixed services. Shown within the antenna coverage area 20 is a client device 24 in the form of a mobile device which may be a cellular telephone as an example. The client device 24 can be any device that is capable of receiving RF communications signals. The client device 24 includes an antenna 26 (e.g., a wireless card) adapted to receive and/or send electromagnetic RF communications signals.

With continuing reference to FIG. 1, to communicate the electrical RF communications signals over the downlink optical fiber 16D to the RAU 14, to in turn be communicated to the client device 24 in the antenna coverage area 20, the HEU 12 includes an electrical-to-optical (E/O) converter 28. The E/O converter 28 converts the downlink electrical RF communications signals 18D to downlink optical RF communications signals 22D to be communicated over the downlink optical fiber 16D. The RAU 14 includes an optical-to-electrical (O/E) converter 30 to convert received downlink optical RF communications signals 22D back to electrical RF communications signals to be communicated wirelessly through an antenna 32 of the RAU 14 to client devices 24 in the coverage area 20. Similarly, the antenna 32 receives wireless RF communications from client devices 24 and communicates electrical RF communications signals representing the wireless RF communications to an E/O converter 34 in the RAU 14. The E/O converter 34 converts the electrical RF communications signals into uplink optical RF communications signals 22U to be communicated over the uplink optical fiber 16U. An O/E converter 36 provided in the HEU 12 converts the uplink optical RF communications signals 22U into uplink electrical RF communications signals, which can then be communicated as uplink electrical RF communications signals 18U back to a network or other source. The E/O converter 28 and the O/E converter 36 constitute a "converter pair" 35.

Figure 2:
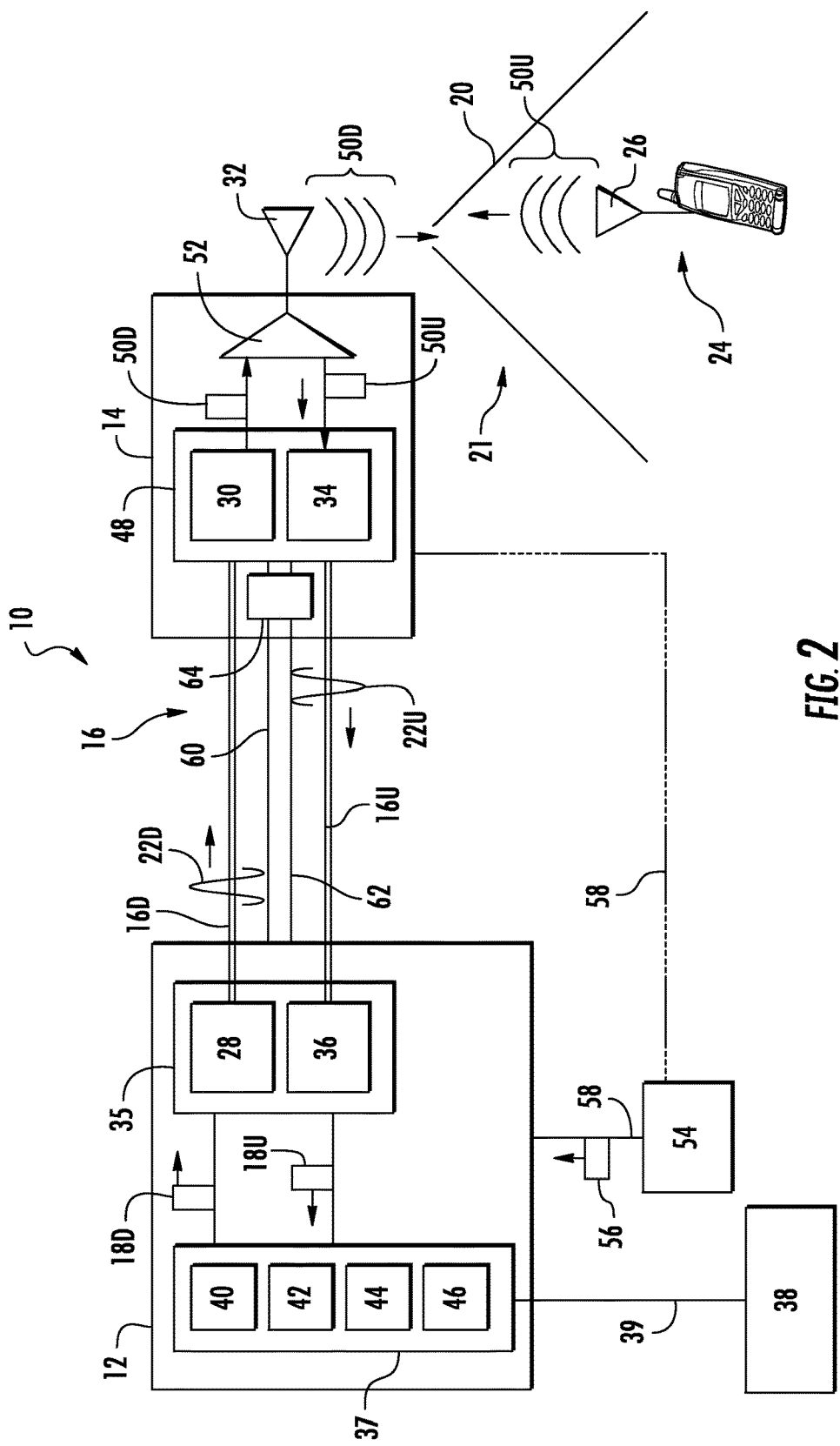
FIG. 2 is a more detailed schematic diagram of exemplary head end equipment and a remote antenna unit (RAU) that can be deployed in the optical fiber-based wireless infrastructure of FIG. 1.

FIG. 2 is a more detailed schematic diagram of the DAS 10 of FIG. 1. In this embodiment, the HEU 12 includes a service unit 37 that provides electrical RF service signals by passing (or conditioning and then passing) such signals from one or more outside networks 38 via a network link 39. In another exemplary embodiment, the service unit 37 provides electrical RF service signals by generating the signals directly. In another exemplary embodiment, the service unit 37 coordinates the delivery of the electrical RF service signals between client devices 24 within the antenna coverage area 20. The service unit 37 is electrically coupled to the E/O converter 28 that receives the downlink electrical RF communications signals 18D from the service unit 37 and converts them to corresponding downlink optical RF communications signals 22D.

With continuing reference to FIG. 2, the HEU 12 also includes the O/E converter 36, which is electrically coupled to the service unit 37. The O/E converter 36 receives the uplink optical RF communications signals 22U and converts them to corresponding uplink electrical RF communications signals 18U. The service unit 37 in the HEU 12 includes an RF communications signal conditioner unit 40 for conditioning the downlink electrical RF communications signals 18D and the uplink electrical RF communications signals 18U, respectively. The service unit 37 can include a digital signal processing unit ("digital signal processor" or "DSP")

42 for providing to the RF communications signal conditioner unit 40 an electrical signal that is modulated onto an RF carrier to generate a desired downlink electrical RF communications signal 18D, and to process a demodulation signal provided by the demodulation of the uplink electrical RF communications signal 18U by the RF communications signal conditioner unit 40. The service unit 37 in the HEU 12 can also include a central processing unit (CPU) 44 for processing data and otherwise performing logic and computing operations, and a memory unit 46 for storing data. The RAU 14 also includes a converter pair 48 of the O/E converter 30 and the E/O converter 34. The O/E converter 30 converts the received downlink optical RF communications signals 22D from the HEU 12 back into downlink electrical RF communications signals 50D. The E/O converter 34 converts uplink electrical RF communications signals 50U received from the client device 24 into the uplink optical RF communications signals 22U to be communicated to the HEU 12. The O/E converter 30 and the E/O converter 34 are electrically coupled to the antenna 32 via an RF signal-directing element 52, such as a circulator.

With continuing reference to FIG. 2, the optical fiber-based DAS 10 also includes a power supply 54 that generates an electrical power signal 56. The power supply 54 is electrically coupled to the HEU 12 for powering the power-consuming elements therein. In an exemplary embodiment, an electrical power line 58 runs through the HEU 12 and over to the RAU 14 to power the O/E converter 30 and the E/O converter 34 in the converter pair 48, the optional RF signal-directing element 52 (unless the RF signal-directing element 52 is a passive device such as a circulator for example), and any other power-consuming elements provided. The electrical power line 58 can include two wires 60 and 62 that carry a single voltage and that are electrically coupled to a DC power converter 64 at the RAU 14. The DC power converter 64 is electrically coupled to the O/E converter 30 and the E/O converter 34 in the converter pair 48, and changes the voltage or levels of the electrical power signal 56 to the power level(s) required by the RAU 14.

Figure 3:
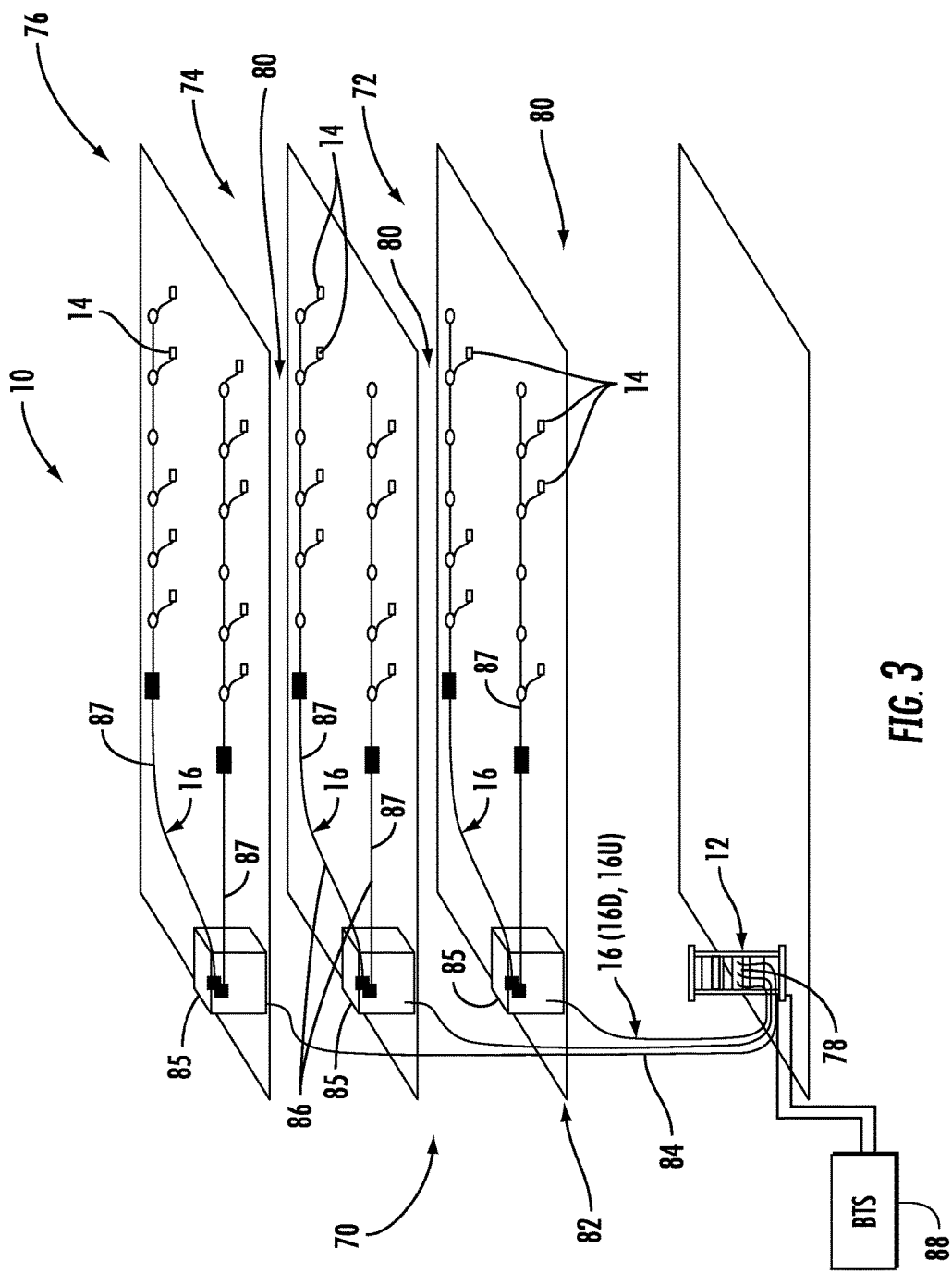
FIG. 3 is a partially schematic cut-away diagram of an exemplary building infrastructure in which the optical fiber-based wireless infrastructure in FIG. 1 can be employed.

FIG. 3 is a partially cut-away schematic diagram of a building infrastructure 70 employing an optical fiber-based DAS 10 incorporating the HEU 12 to provide various types of communication services within the building infrastructure 70. The DAS 10 in this embodiment is configured to receive wireless RF communications signals and convert the RF communications signals into RoF signals to be communicated over the optical fiber 16 to multiple RAUs 14 to provide wireless services such as cellular service, wireless services such as RFID tracking, Wireless Fidelity (WiFi), local area network (LAN), and WLAN inside the building infrastructure 70. The building infrastructure 70 in this embodiment includes a first (ground) floor 72, a second floor 74, and a third floor 76. The floors 72, 74, 76 are serviced by the HEU 12 through a main distribution frame 78 to provide antenna coverage areas 80 in the building infrastructure 70. In the example embodiment, a main cable 82 has a number of different sections that facilitate the placement of a large number of RAUs 14 in the building infrastructure 70. Each RAU 14 in turn services its own coverage area in the antenna coverage areas 80. The main cable 82 can include, for example, a riser cable 84 that carries all of the downlink and uplink optical fibers 16D, 16U to and from the HEU 12. The riser cable 84 may be routed through an interconnect unit (ICU) 85 at each floor. The ICU 85 may be provided as part of or separate from the power supply 54 in FIG. 2. The ICU 85 may also be configured to provide power to the RAUs 14 via the electrical power line 58, as illustrated in FIG. 2, provided inside an array cable 87.

A base transceiver station (BTS) 88, which may be provided by a second party such as a cellular service provider, is connected to the HEU 12. A BTS is any station or source that provides an input signal to the HEU 12 and can receive a return signal from the HEU 12. In a typical cellular system, for example, a plurality of BTSs are deployed at a plurality of remote locations to provide wireless telephone coverage. Each BTS serves a corresponding cell and when a mobile station enters the cell, the BTS communicates with the mobile station. The DAS 10 in FIGS. 1-3 provides point-to-point communications between the HEU 12 and the RAU 14. Each RAU 14 communicates with the HEU 12 over a distinct downlink and uplink optical fiber pair to provide the point-to-point communications. Multiple downlink and uplink optical fiber pairs can be provided in a fiber optic cable to service multiple RAUs 14 from a common fiber optic cable.

RF systems, such as the DAS 10 in one non-limiting embodiment, may include in many cases multiple cables connecting between various boards, modules or subsystems. The RF cables are usually connected by the use of either thread or snap based connectors. During installation, it is important to verify that the right ports are connected, and during the on-going operation it is important that reliable connections are maintained. Installations of conventional DAS systems are typically labor-intensive, and during normal operation, cables may become disconnected or require a change in connection between various components. Manual checking and verification of cable connections adds to the cost of maintaining such systems.

Embodiments are now disclosed that include a method for cabling connectivity and verification, and related apparatuses and systems, in which the checking and verification of cable connections in RF systems can be automated such that the checking and verification of cable connections in RF systems can be done quickly and cheaply without having to add expensive and space-consuming equipment.

Figure 4:
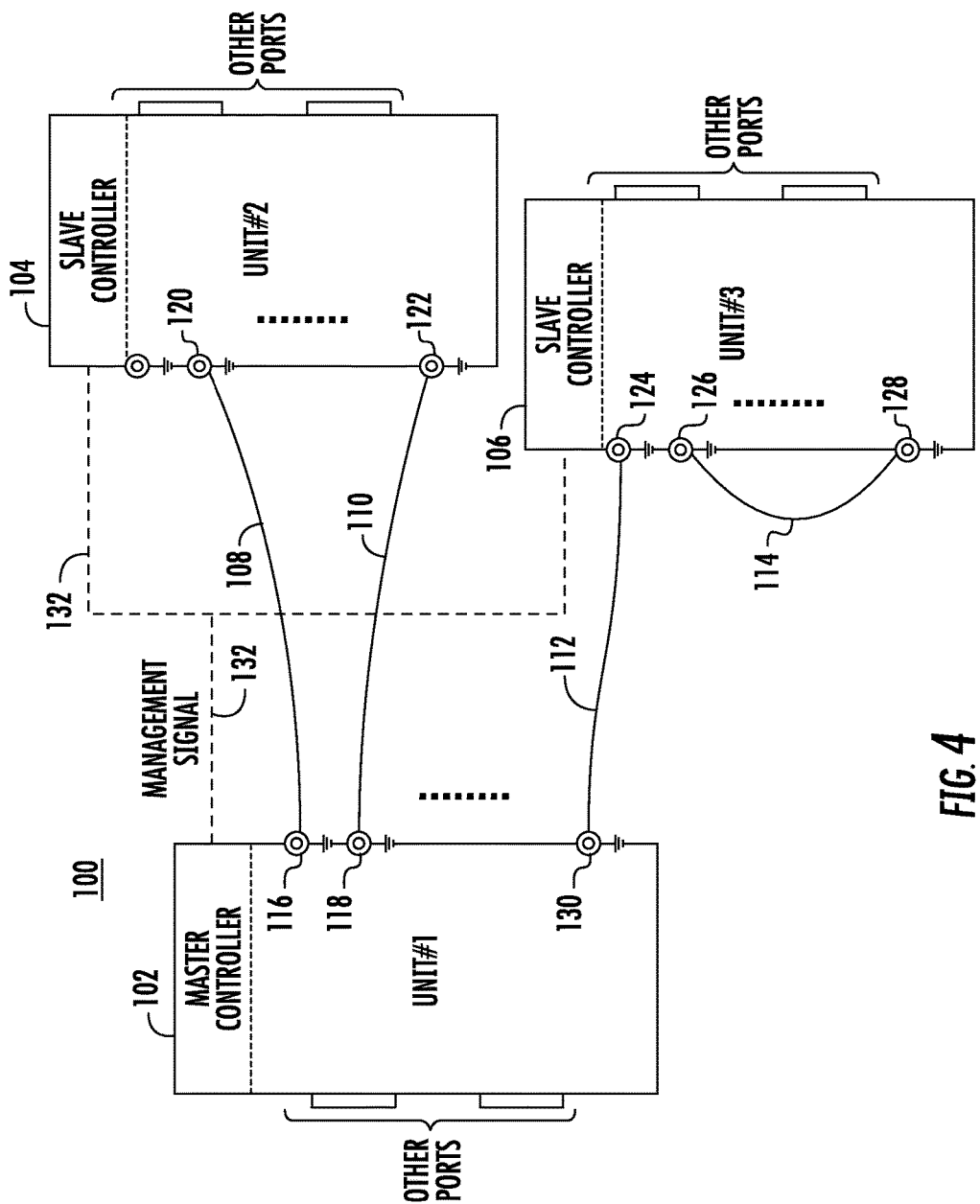
FIG. 4 is a schematic of a wireless system having three components interconnected by cables.

FIG. 4 is a schematic of a system 100 having three components, or subsystems 102, 104, 106 interconnected by cables. In the illustrated embodiment, the components 102, 104, 106 are connected by RF signal-carrying cables, such as, for example, coaxial cables, and the system 100 can be described as an RF system. In one embodiment, component 102 may be a master controller, and components 104 and 106 may be slave controllers.

Figure 5:
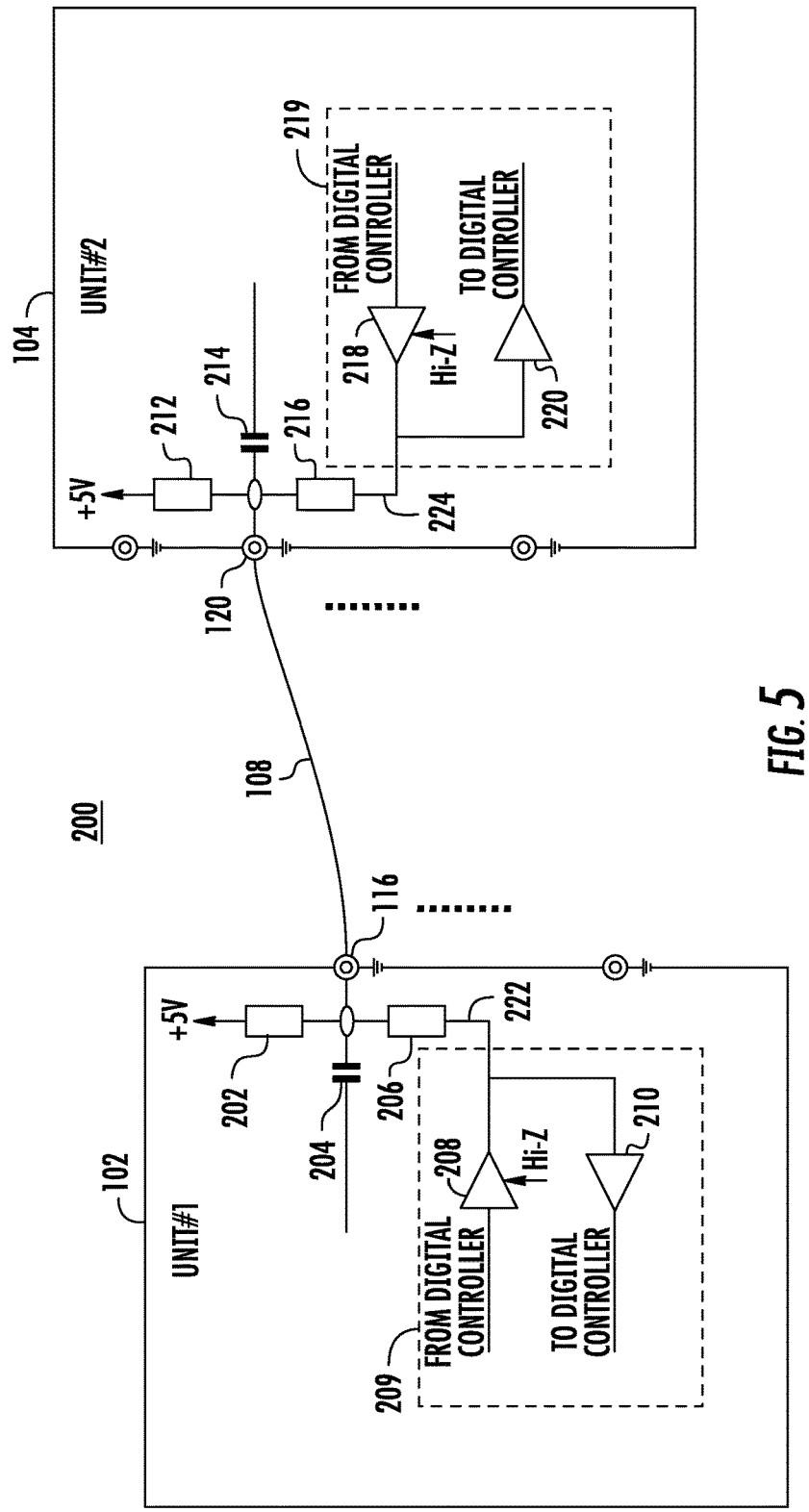
FIG. 5 is a schematic of a circuit used to monitor connectivity between components.
Figure 6:
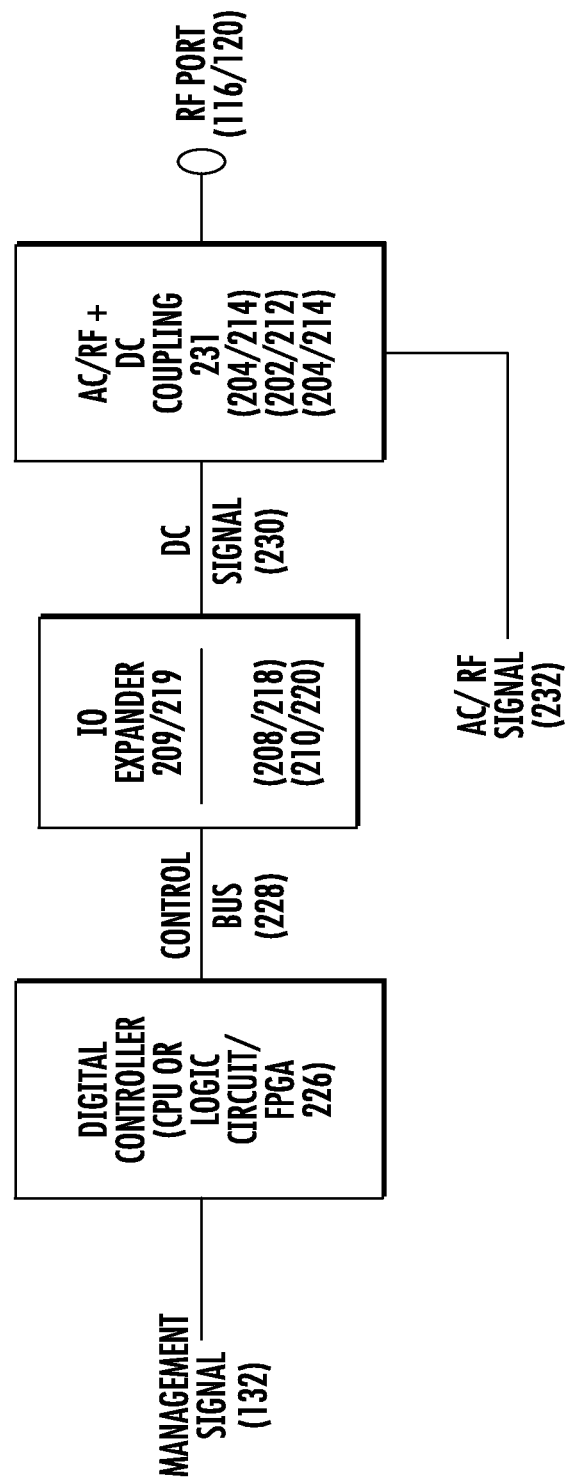
FIG. 6 is a block diagram that may represent the elements of components of the wireless system of FIG. 4 in function blocks.

FIG. 5 is a schematic of a circuit 200 used to monitor connectivity between the components 102 and 104. The circuit 200 can constitute, or be part of, a test system for testing the connectivity of components in a communications system. FIG. 6 is a block diagram that may represent the elements of the components 102, 104, or 106 in function blocks. According to one aspect of the present embodiment, the circuit 200 can be used to determine whether the interconnect cabling is properly connected during installation of the components 102, 104, 106, and also used to monitor connectivity during operation of the components 102, 104, 106 within a system. The components 102, 104, 106 can be incorporated into systems such as DAS, including the optical-fiber based DAS 10 discussed with reference to FIGS. 1-3. The circuit 200 can generate an alarm in response to a fault condition during installation of and operation of the DAS.

Referring to FIG. 4, an exemplary system 100 includes three units: a first unit (or component) 102, a second unit (or component) 104, and a third unit (or component) 106. In the embodiment shown in FIG. 4, four cables 108, 110, 112, 114 connect between various RF ports of the system 100, though the system 100 may have any number of cables connecting various RF ports of the system 100. In one embodiment, the cables 108, 110, 112, and 114 may be RF cables. Cable 108 connects between RF port 116 (Port 1-1) and RF port 120 (Port 2-2). Cable 110 connects between RF port 118 (Port 1-2) and RF port 122 (Port 2-N). Cable 112 connects between RF port 130 (Port 1-N) and RF port 124 (Port 3-1). Cable 114 connects between RF port 126 (Port 3-2) and RF port 128 (Port 3-N). A management signal 132, which travels on a path indicated by the dashed lines between the components 102, 104, 106, is used for bidirectional transfer of commands and indications between the control segments of the components 102, 104, 106.

Referring to FIGS. 5 and 6, the electronic circuit 200 is adapted to monitor connectivity between RF port 116 and RF port 120. RF port 116 and RF port 120 are on components 102 and 104, respectively. Each of the components 102 and 104 may be similar in one embodiment. For example, component 102 has a resistor 202, a capacitor 204, and a resistor 206. In a similar fashion, component 104 has a resistor 212, a capacitor 214, and a resistor 216. In a "no test" state, the output signal general purpose input/output (GPIO) signal 222 and 224, respectively, of the digital buffers 208 and 218 exhibits high impedance, using the "three-state" feature. The digital buffers 208 and 218 in components 102 and 104, respectively, are connected to a digital controller 226 (see FIG. 6), and receive signals from the digital controller 226. Digital buffers 210 and 220 in components 102 and 104, respectively, are connected to a digital controller 226 (see FIG. 6), and can send signals to the digital controller 226. In one embodiment, the digital buffers 208 and 210 may be provided by an I/O expander 209, and then digital buffers 218 and 220 may be provided by an I/O expander 219.

In the high impedance state, the DC voltages on RF port 116 and RF port 120 are pulled through resistors 202 and 212 in components 102 and 104, respectively, to about +5 volts. For purposes of this application, "high impedance" is generally any impedance higher than that of the RF signal, which in various embodiments, may be about fifty kiloOhms (50 KOhm) or about seventy-five kiloohms (75 KOhms), or other values. In one embodiment, the GPIO signals 222 and 224 may have an impedance of about one kiloOhm (1 Kohm). The DC voltages on RF port 116 and RF port 120 being pulled through resistors 202 and 212 in components 102 and 104, respectively, to about +5 volts does not have any impact on the RF signal and its related circuits due to the high resistance of resistors 202 and 212 and the DC blocking capacitors 204 and 214, in components 102 and 104, respectively. In one embodiment, the DC impedance is blocked by one or more of the DC blocking capacitors 204 and 214 in components 102 and 104, respectively. In one embodiment, the DC blocking capacitors 204 and 214 may have a value of about fifty picoFarads (50 PF).

The embodiments shown in FIGS. 5 and 6 allow a low cost implementation because the GPIO ports, which are present in the components of most RF systems, can be used to check the connectivity of the cables between the components. In addition, in order not to affect the AC/RF/IF signal performance in the system, the resistors 202 and 212 can be high impedance resistors in order to inject the GPIO logic states into the copper. As one non-limiting example, the resistors 202 and 212 can be ten kiloOhms (10 KOhm) and the resistors 206 and 216 can be one kiloOhm (1 KOhm). Further, in one embodiment, a pull up resistor can be used at each port to ensure that the series resistors will not change the logic states at each port. In the system shown in FIGS. 5 and 6, no diode(s), comparator(s), or threshold settings are needed to check the connectivity of the cables between the components. Moreover, because the GPIO ports exist on both sides of the cable, there is a higher level of flexibility in checking the cable connections. A signal can be transmitted from both sides of the line, so almost any management software methods can implement the test in both directions, with steps taken to ensure there is no conflict or contention during the test, such as by timing the application of the logic states on the various ports, in one embodiment.

When it is desired to test the connectivity between the two ports, such as during installation of a DAS (such as DAS 10) including the components 102, 104, 106, the buffer 208 is instructed to provide low voltage (e.g., close to ground potential) at its output signal GPIO 222. If the RF cable 108 is connected properly, the DC voltage at RF port 116 in the embodiment of FIG. 5 will then be approximately 0.833 Volt (a result of the division of the +5 Volt by the voltage divider comprised of resistors 202 in parallel with resistor 212 and resistor 206 in series) and the same voltage (+0.833 Volt) will appear at port 120 and will be sensed by the input of buffer 220. The input buffer 220 may then provide an indication of a specified logic state, such as "logic level=0" to the digital controller. The electronic circuit 200 that performs the monitoring has little or no impact on the RF communications signals passing through the systems because of high resistance 222, 224, and 202, 212.

Referring to FIG. 6, a management signal 132 is received at a digital controller 226 in one of the components, such as component 102 or component 104 (see, e.g., FIG. 5). In one embodiment, the management signal 132 may come from a master controller 102 (see, e.g., master controller 102, FIG. 4). In one embodiment, the digital controller 226 may be a computer processing unit (CPU), a logic circuit, or a field programmable gate array (FPGA), as non-limiting examples. The digital controller 226 provides the management signal 132 via a control bus 228 toward a port (such as RF port 116 or 120 of FIG. 5). There may be an optional I/O expander 209 or 219, comprising the digital buffers 208, 210 and 218, 220, respectively. The I/O expanders 209, 219 may be used to provide additional ports. Referring again to FIG. 6, a DC signal 230 is provided to an AC or RF plus DC coupling functionality 231 (resistors 202 and 212, together with capacitors 204 and 214), which ensure that the AC or RF signal 232 is not adversely affected. The logic signal is then applied to the port (RF port 116 or RF port 120 of FIG. 5).

Figure 7:
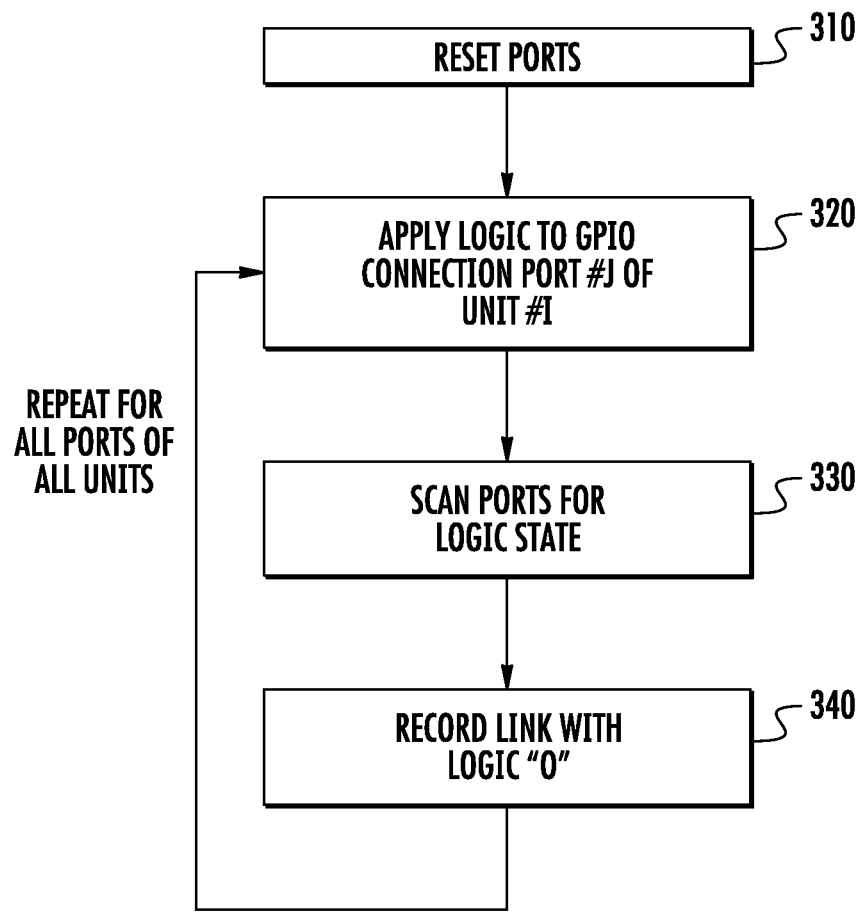
FIG. 7 illustrates a test procedure for testing the connectivity of cables between components.

FIG. 7 illustrates an exemplary test procedure for testing the connectivity of cables between components. The test procedure can be performed during installation of a system, during operation, and/or during planned downtime. Referring also to FIGS. 4 and 5, the procedure is managed by the master controller 102, while the slave controllers 104, 106 work in conjunction with the master controller 102. The management signal 132 (FIG. 4) is used to coordinate between all controller actions.

Test Process

In step 310, all ports are reset, and all GPIO signals (e, g. GPIO signals 222, 224 of FIG. 5) in the system 10 are set to high impedance.

In step 320, a logic signal is applied on the GPIO connection to a first port of a first component (i.e., Port#j of Unit#i). The logic "0" signal may be applied, for example, as a low voltage at Port#j of Unit#i. In one non-limiting example, the logic signal is a logic "0" signal.

In step 330, the digital controller (such as digital controller 226 in FIG. 6), which can have management software designed to carry out monitoring processes, scans all ports, which can be input or output ports, to detect where the logic signal (e.g., logic "0" signal) is detected. If the cables in the system are connected in a point-to-point topology, as in the illustrated embodiment, only one GPIO port should detect the low voltage logic "0" signal. The ports that are scanned can be ports on components different from the component to which the logic signal was applied, or can be other ports on the same component to which the logic signal was applied.

In step 340, the newly detected link is recorded. The logic state is changing at the receiving end, in response to the applied voltage. In one embodiment, the detected link is recorded only if the same logic signal applied at the first port is present and sensed at a second port of the components during the scanning step. In various embodiments, the second port where the logic signal is present and sensed may be at a port of a second component, or it could be a second port of the component to which the logic signal was applied. Steps 310-330 may then be repeated for all components and system GPIOs.

False positive connectivity (where a logic signal is detected, but the ports are not supposed to be connected) can be checked by removing the logic signal from the first port (Port#j of Unit#i). If a logic signal is still detected at the other port, then a false positive exists and an alarm may be generated (i.e., the port may be defective).

The above-described method describes a monitoring process in which all ports are scanned. Depending upon the application, a single port, or selected ports may be selectively scanned and monitored. Scanning can occur over selected time cycles to ensure continuous proper connection of a monitored system. For example, scanning can be repeated several times per hour to ensure system connectivity.

According to the present embodiments, connectivity is quickly and accurately monitored and verified by applying a low DC voltage at one end of an RF cable, interpreted as a preselected logical state, and checking whether a similar voltage appears at the other end of the cable. If the cable is connected properly, the DC voltage, applied at one end will appear at the other end and a proper indication is generated. If the expected voltage level does not appear at the other side, it means that an RF connection was not made and an alert is generated. Alerts can include alerts on a graphical display, a light, a sound, text, or a text message transmitted in response to a change. For offsite management systems, alerts can be transmitted remotely, such as over the Internet, to remote sites. The electronic circuit that performs the monitoring has little or no impact on the RF signals passing through the system.

Notably, the above method is performed using a common and standard digital interface with a logic signal that has only two (2) states. Thus, the solution is simple and very low cost. In addition, this solution can be used as part of any copper based cable connection continuity check. The method can be used to test any cable connected between ports on a single unit or cables connected between different units. As such, it is feasible for both small and very large deployments of any electronic systems where AC, RF, or IF signal connectivity check is needed.

Figure 8:
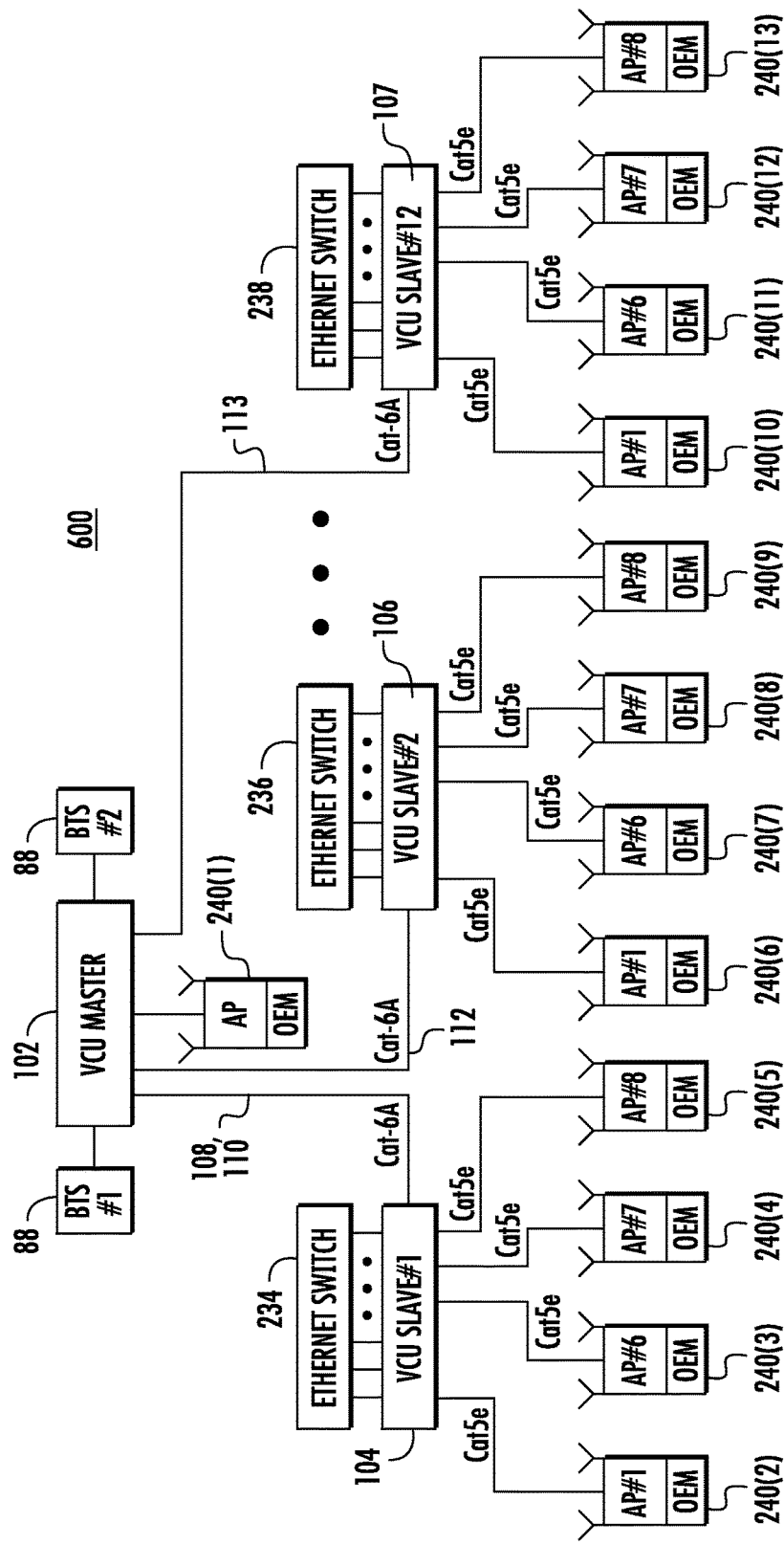
FIG. 8 is a schematic of an exemplary DAS with exemplary components that may correspond to components shown in FIG. 4.

FIG. 8 is a schematic of an exemplary DAS 600 with exemplary components that may correspond to the components shown in FIG. 4. The architecture of the DAS 600 may coincide with the MobileAccessVE system available from Corning MobileAccess Inc., of Vienna, Va., with the added functionalities of component monitoring and verification according to the present embodiments. The illustrated DAS 600 is a multi-tier architecture, utilizing metallic twisted pair cabling, which may coincide with existing building MILAN cabling. The DAS 600 has a master controller 102 connected to slave controller 104 by one or more cables 108, 110, and also connected to a slave controller 106 by a cable 112, and to a slave controller 107 by a cable 113. The master controller 102 may also be connected to one or more BTS's 88. The master controller 102 may also be connected to additional slave controllers. The slave controllers 104, 106, and 107 may be associated with Ethernet Switches 234, 236, and 238, respectively. Each of the controllers is also connected to one or more antennas, in this case 'access pods' 240(1) through 240(13), capable of transmitting and receiving RF communications signals to and from its own coverage area. In one embodiment, as shown in FIG. 8, the cables between the components are Cat-5 cables. In this embodiment, the signals may be IF signals. The connectivity between any of the controllers and/or any of the other components in FIG. 8 can be checked using the methods and systems disclosed herein.

Figure 9:
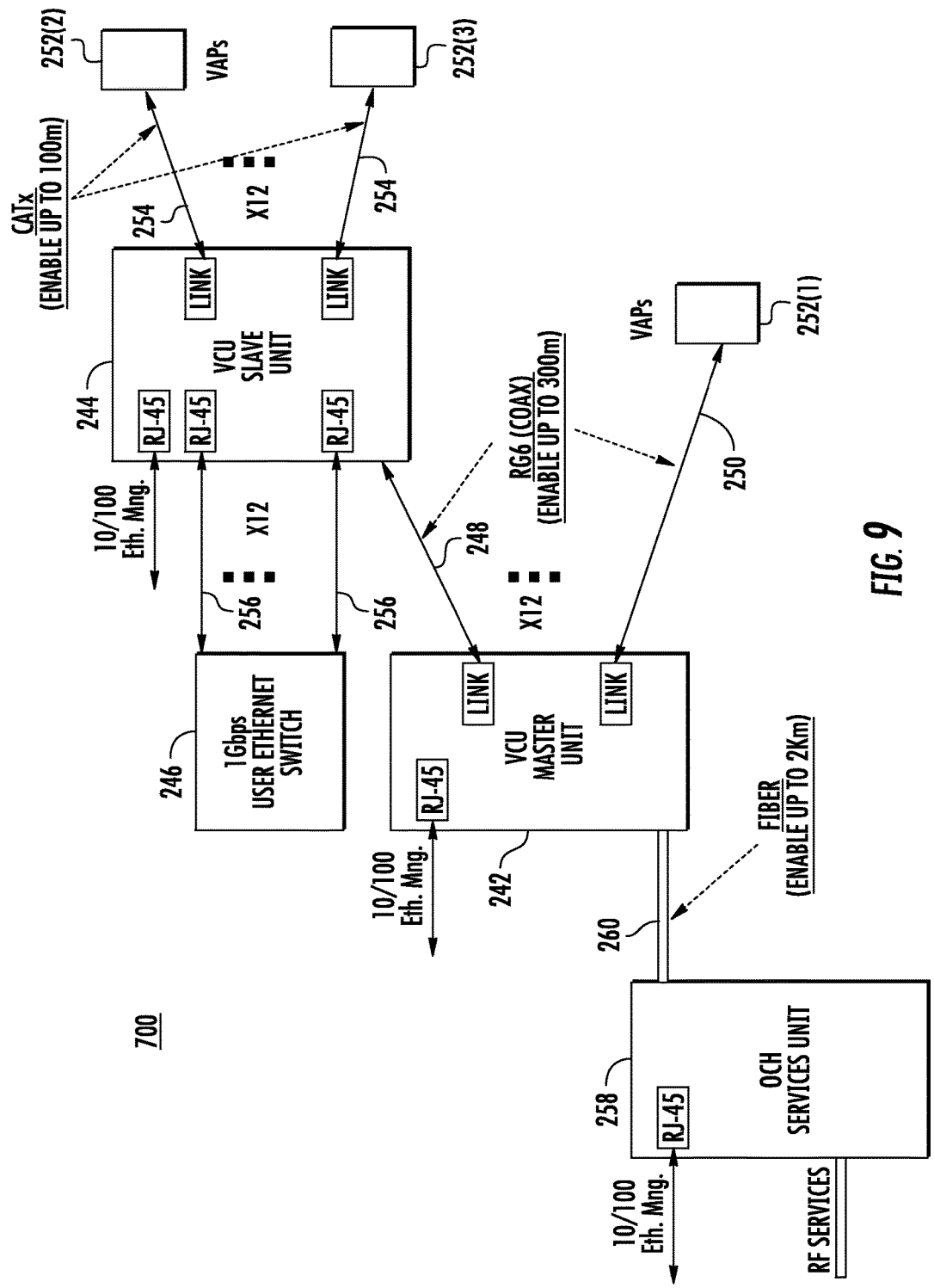
FIG. 9 is a block diagram of an exemplary DAS with exemplary components that may correspond to components shown in FIG. 4.

FIG. 9 is a block diagram of an exemplary DAS 700 with exemplary components that may correspond to the components shown in FIG. 4. FIG. 9 may include a master unit 242 connected to a slave unit 244. The slave unit 244 may be connected to an Ethernet switch 246. The master unit 242 may be communicatively coupled to the slave unit 244 via coaxial cable 248. The master unit 242 may also be communicatively coupled to access point 252(1) via coaxial cable 250. The slave unit 244 may be communicatively coupled to access points 252(2) and 252(3) via coaxial cables 254. The slave unit 244 may be communicatively coupled to the Ethernet switch 246 via Ethernet cables 256. In addition, the master unit 242 may be communicatively coupled to a services unit 258 via optical fiber 260. The connectivity between any of the components in FIG. 9 can be checked using the methods and systems disclosed herein, despite the fact that they may be connected via various types of connections.

Figure 10:
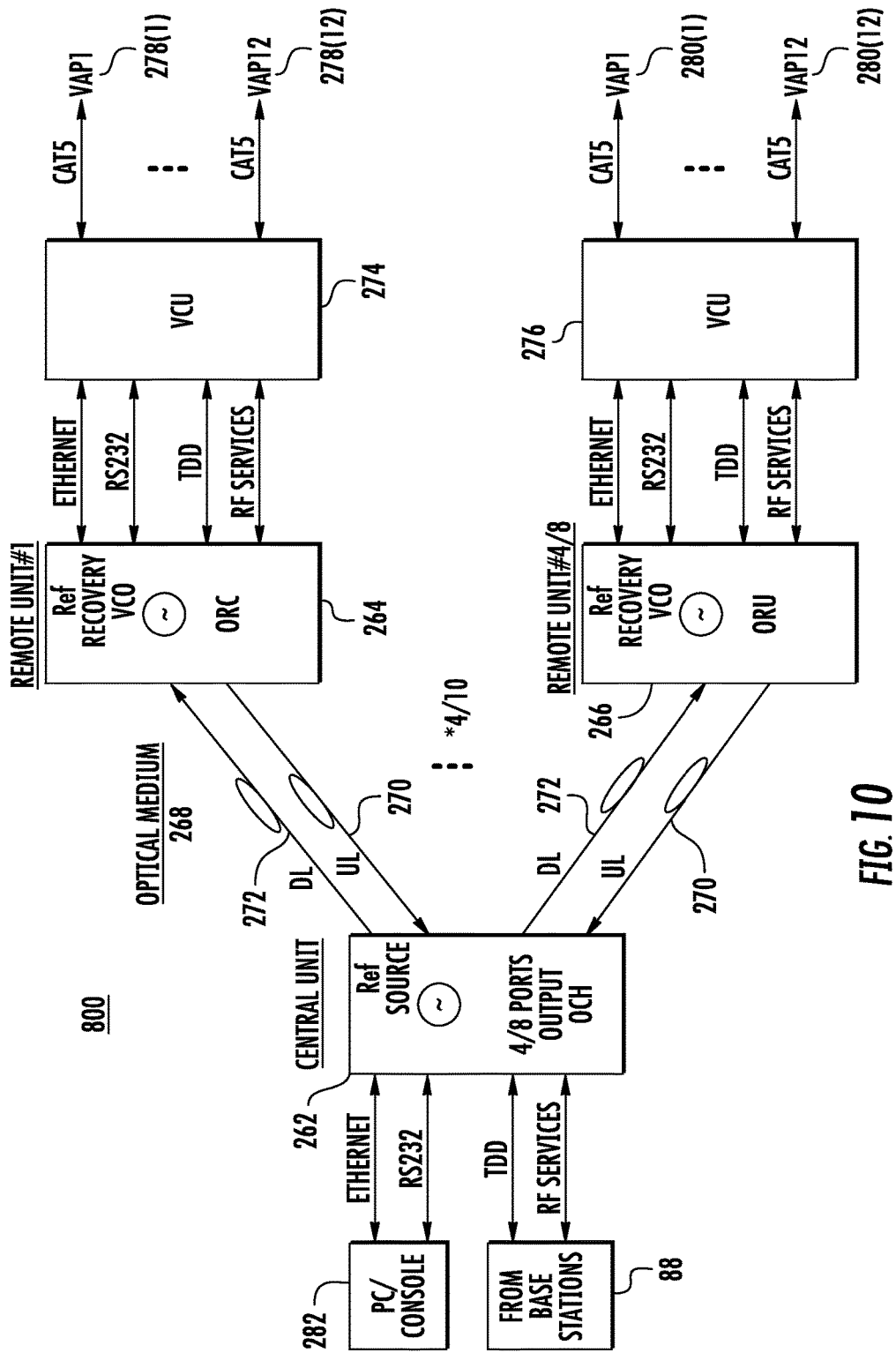
FIG. 10 is a block diagram of an exemplary DAS with optical links and having exemplary components that may correspond to components shown in FIG. 4.

FIG. 10 is a block diagram of an exemplary DAS 800 with optical links and having exemplary components that may correspond to the components shown in FIG. 4. FIG. 10 may include a central unit 262 communicatively coupled to remote units 264 and 266 by means of optical medium 268, including an uplink 270 and a downlink 272. The remote units 264 and 266 may be communicatively coupled to respective VCUs 274 and 276 via a variety of connection types. The VCUs 274 and 276 may be communicatively coupled to access points 278(1) through 278(12) and 280(1) through 280(12) respectively, via Cat5 cable. The central unit 262 may also be connected to base stations 88 and to a personal computer (PC) or console 282 via a variety of means. The connectivity between any of the components in FIG. 10 can be checked using the methods and systems disclosed herein, despite the fact that they may be connected via various types of connections.

The embodiments discussed herein provide a mechanism that reduces time and cost of installation through reliable verification of connection status. The embodiments are also effective for ongoing monitoring of connection status.

In the present disclosure, including the appended claims, references may be made to a first, second, third, etc. component, port, cable, or other element. These reference are not intended to imply a particular order or orientation of any element, or to imply that references to a particular numbered element requires the presence or a preceding or succeeding element, unless specifically enumerated in the description or claims.

The wireless infrastructures disclosed in this specification can include radio interface modules (RIM) in the HEU, each of which may support a particular type of radio source or range of radio sources (i.e., frequencies) to provide flexibility in configuring the head end equipment. For example, one radio interface module may be configured to support the Personal Communication Services (PCS) radio band. Another RIM may be configured to support the Long Term Evolution (LTE) 700 radio band. Radio interface modules may be provided in the head end equipment that support any other radio bands desired, including but not limited to PCS, LTE, CELL, GSM, CDMA, CDMA2000, TDMA, AWS, iDEN, Enhanced Data GSM Environment, (EDGE), Evolution-Data Optimized (EV-DO), 1×RTT (i.e., CDMA2000 1× (IS-2000)), High Speed Packet Access (HSPA), 3GGP1, 3GGP2, and Cellular Digital Packet Data (CDPD).

Optical interface modules (OIM) may be provided in a common housing provided for the head end equipment to provide one or more optical interface components (OICs) that contain O/E and E/O converters, as will be described in more detail below. The OIMs support the radio bands that can be provided by the RIMs, including the examples previously described above. The OIMs each include E/O converters to convert downlink electrical RF communications signals to downlink optical signals. The downlink optical signals are communicated over downlink optical fiber(s) to the remote units. E/O converters are also provided in the remote units to convert uplink electrical RF communications signals received from client devices through the antennas into uplink optical signals to be communicated over uplink optical fibers to the OIMs. The OIMs include 0/E converters that convert the uplink optical signals into uplink electrical RF communications signals that are processed by the RIMs and provided as uplink electrical RF communications signals.

Those of skill in the art would further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The components of the wireless infrastructures described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a digital signal processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A controller may be a processor. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, as used herein, it is intended that terms "fiber optic cables" and/or "optical fibers" include all types of single mode and multi-mode light waveguides, including one or more optical fibers that may be upcoated, colored, buffered, ribbonized and/or have other organizing or protective structure in a cable such as one or more tubes, strength members, jackets or the like.

Many modifications and other embodiments of the embodiments set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims.

Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

What is claimed is:

1. A method of testing a system having a plurality of components, each component having at least one radio frequency (RF) port, and a plurality of cables connected to the at least one RF port of the plurality of components, the method comprising:
applying a first voltage indicating at least a first logic state to a first RF port of a first component of the plurality of components, wherein the first RF port is configured to carry RF signals, and the first component comprising a direct current (DC) blocking circuit causing the first voltage applied to the first RF port to not impact the RF signals carried by the first RF port by providing a high impedance higher than an impedance of the RF signals to the first RF port and blocking the high impedance from the RF signals and circuits related to the RF signals;
scanning multiple input ports of the plurality of components by a controller;
recording by the controller an RF link between the first RF port and an input port among the scanned multiple input ports corresponding to the applied first logic state at the first RF port of the first component; and
providing a plurality of remote units capable of transmitting wireless signals into respective coverage areas of the plurality of remote units, and for receiving wireless signals from their respective coverage areas, the plurality of remote units being optically connected to at least one of the plurality of components, wherein the plurality of remote units are optically connected to the at least one of the plurality of components by a cable of the plurality of cables including at least one optical fiber.

2. The method of claim 1, further comprising:
applying a second voltage indicating a second logic state to a second RF port of a second component of the plurality of components, wherein the second RF port is configured to carry RF signals, and the second component comprising a second DC blocking circuit causing the second voltage applied to the second RF port to not impact the RF signals;
automatically scanning the multiple input ports of the plurality of components by the controller; and
automatically recording by the controller an RF link between the second RF port and an input port among the scanned multiple input ports corresponding to the applied second logic state at the second RF port of the second component.

3. The method of claim 1, wherein steps of applying, scanning, and recording are performed for each RF port of each component of the system, and wherein the plurality of components comprises at least a first, a second, and a third RF component capable of processing the RF signals.

4. The method of claim 1, further comprising operating the system to provide wireless services to client devices.

5. The method of claim 4, wherein the first RF port is an input port.

6. The method of claim 4, wherein the first RF port is an output port.

7. The method of claim 4, further comprising resetting the first RF port prior to the applying of the first logic state to the first RF port.

8. The method of claim 4, wherein the RF link is recorded only if the first logic state is present at a second RF port of the plurality of components during the scanning step.

9. The method of claim 1, further comprising detecting a false positive connectivity of the recorded RF link between the first RF port and the input port by removing the first voltage indicating the first logic state from the first RF port and detecting that the input port remains in the first logic state.

10. A test system for testing a communication system having a plurality of components and a plurality of cables connected to at least one RF port of the plurality of components, the test system comprising:
a first component comprising:
at least one first RF port configured to carry RF signals; and
a direct current (DC) blocking circuit, comprising:
at least one resistor for providing a high impedance higher than an impedance of the RF signals to the at least one first RF port; and
at least one capacitor configured to block the high impedance of the at least one resistor from the RF signals and circuits related to the RF signals; and
a controller configured to:
apply a first voltage indicating a first logic state to the at least one first RF port of the first component, wherein the DC blocking circuit is configured to cause the first voltage applied to the at least one first RF port to not impact the RF signals;
scan multiple input ports of the plurality of components; and
record an RF link between the at least one first RF port and an input port among the scanned multiple input ports corresponding to the applied first logic state at the at least one first RF port of the first component, wherein
the communication system further comprises a plurality of remote units configured to transmit wireless signals into respective coverage areas of the plurality of remote units, and configured to receive wireless signals from their respective coverage areas, the plurality of remote units being optically connected to at least one of the plurality of components.

11. The test system of claim 10, wherein the controller is further configured to:
apply a second voltage indicating a second logic state to a second RF port of a second component of the plurality of components, wherein the second RF port is configured to carry RF signals, and the second component comprising a second DC blocking circuit causing the second voltage applied to the second RF port to not impact the RF signals;
automatically scan the multiple input ports of the plurality of components; and
automatically record an RF link between the second RF port and an input port among the scanned multiple input ports corresponding to the applied second logic state at the second RF port of the second component.

12. The test system of claim 10, wherein the controller is further configured to perform steps of applying, scanning, and recording for each RF port of each component of the plurality of components.

13. The test system of claim 10, wherein the plurality of components comprises at least a first, a second, and a third RF component capable of processing the RF signals.

14. The test system of claim 10, wherein the at least one capacitor and the at least one resistor for providing the high impedance are configured to cause the first voltage applied to the at least one first RF port to not impact the RF signals.

15. The test system of claim 10, wherein the RF link between the at least one first RF port and the input port among the scanned multiple input ports corresponding to the applied first logic state at the at least one first RF port of the first component is provided by a coaxial cable.

16. The test system of claim 10, wherein the controller is further configured to detect a false positive connectivity of the recorded RF link between the at least one first RF port and the input port by removing the first voltage indicating the first logic state from the at least one first RF port and detecting that the input port remains in the first logic state.

17. The test system of claim 10, wherein the controller is further configured to apply the first voltage indicating the first logic state to the at least one first RF port of the first component of the plurality of components when the RF signals are present at the at least one first RF port.

18. The test system of claim 10, wherein the DC blocking circuit is coupled to the at least one first RF port.

* * * * *